US009672917B1

(12) United States Patent
Costa et al.

(10) Patent No.: US 9,672,917 B1
(45) Date of Patent: Jun. 6, 2017

(54) STACKED VERTICAL MEMORY ARRAY ARCHITECTURES, SYSTEMS AND METHODS

(71) Applicant: SANDISK TECHNOLOGIES LLC, Plano, TX (US)

(72) Inventors: Xiying Costa, San Jose, CA (US); Henry Chien, Milpitas, CA (US); Yao-Sheng Lee, Tampa, FL (US); Yanli Zhang, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/166,242

(22) Filed: May 26, 2016

(51) Int. Cl.
*G11C 16/04* (2006.01)
*H01L 27/11582* (2017.01)
*G11C 16/08* (2006.01)
*G11C 16/26* (2006.01)
*H01L 27/1157* (2017.01)
*H01L 27/11565* (2017.01)
*H01L 27/11573* (2017.01)

(52) U.S. Cl.
CPC .......... *G11C 16/0483* (2013.01); *G11C 16/04* (2013.01); *G11C 16/0466* (2013.01); *G11C 16/08* (2013.01); *G11C 16/26* (2013.01); *H01L 27/1157* (2013.01); *H01L 27/11565* (2013.01); *H01L 27/11573* (2013.01); *H01L 27/11582* (2013.01)

(58) Field of Classification Search
CPC . G11C 16/0483; G11C 16/0466; G11C 16/08; G11C 16/26; H01L 27/11582; H01L 27/1157; H01L 27/11565; H01L 27/11573
See application file for complete search history.

(56) References Cited

U.S. PATENT DOCUMENTS

| 7,812,390 | B2 * | 10/2010 | Park | G11C 11/5621 257/211 |
|---|---|---|---|---|
| 8,445,347 | B2 | 5/2013 | Alsmeier | |
| 8,897,070 | B2 | 11/2014 | Dong | |
| 9,286,989 | B2 | 3/2016 | D'Abreu | |
| 2005/0094428 | A1 * | 5/2005 | Futatsuyama | G11C 16/02 365/145 |
| 2006/0146608 | A1 * | 7/2006 | Fasoli | G11C 16/0483 365/185.17 |

(Continued)

*Primary Examiner* — Khamdan Alrobaie
*Assistant Examiner* — Ajay Ojha
(74) *Attorney, Agent, or Firm* — Vierra Magen Marcus LLP

(57) ABSTRACT

Systems and methods for implementing and using stacked vertical memory array architectures. A first NAND string may be formed or arranged above a second NAND string. The first NAND string may include a first drain-side select gate connected to a first set of memory cell transistors connected to a first source-side select gate. The second NAND string may include a second drain-side select gate connected to a second set of memory cell transistors connected to a second source-side select gate. The first NAND string and the second NAND string may comprise portions of the same or different memory array architectures (e.g., the first NAND string may be part of a memory array that uses U-shaped NAND strings and the second NAND string may be part of a memory array that uses single vertical NAND strings).

14 Claims, 20 Drawing Sheets

(56) References Cited

U.S. PATENT DOCUMENTS

| | | | |
|---|---|---|---|
| 2008/0031048 A1* | 2/2008 | Jeong | H01L 21/8221 365/185.17 |
| 2013/0161727 A1* | 6/2013 | Kim | G11C 16/0483 257/324 |
| 2015/0236038 A1* | 8/2015 | Pachamuthu | H01L 27/11582 257/326 |
| 2015/0364198 A1* | 12/2015 | D'Abreu | G11C 16/16 365/185.11 |

* cited by examiner

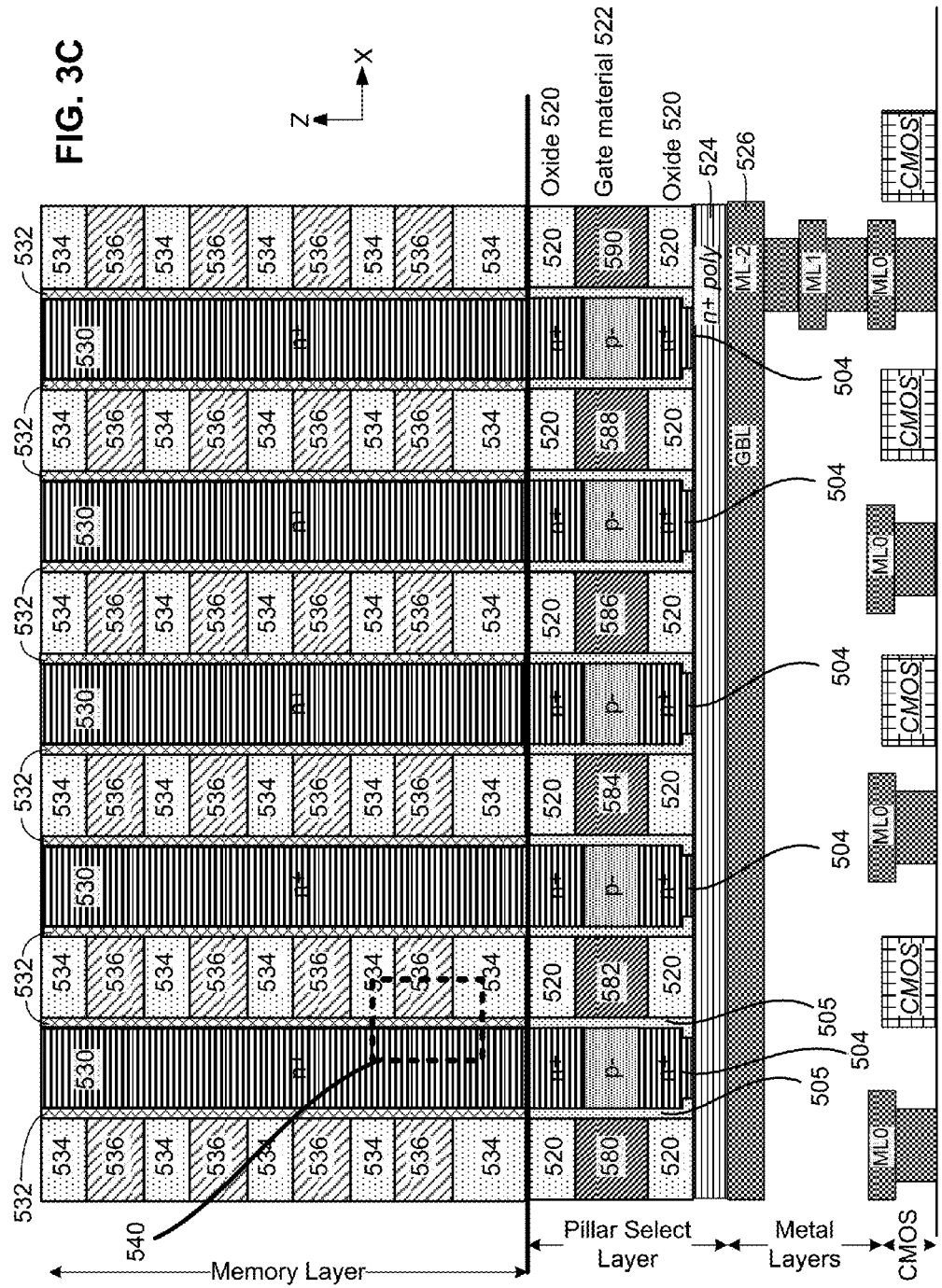

STACKED VERTICAL MEMORY ARRAY ARCHITECTURES, SYSTEMS AND METHODS

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled in order to reduce the cost per bit. However, as process geometries shrink, many design and process challenges are presented. These challenges include increased variability in memory cell I-V characteristics over process, voltage, and temperature variations.

BRIEF DESCRIPTION OF THE DRAWINGS

FIGS. 3A-3C depict various embodiments of a portion of a three-dimensional memory array.

DETAILED DESCRIPTION

Figure 1A:
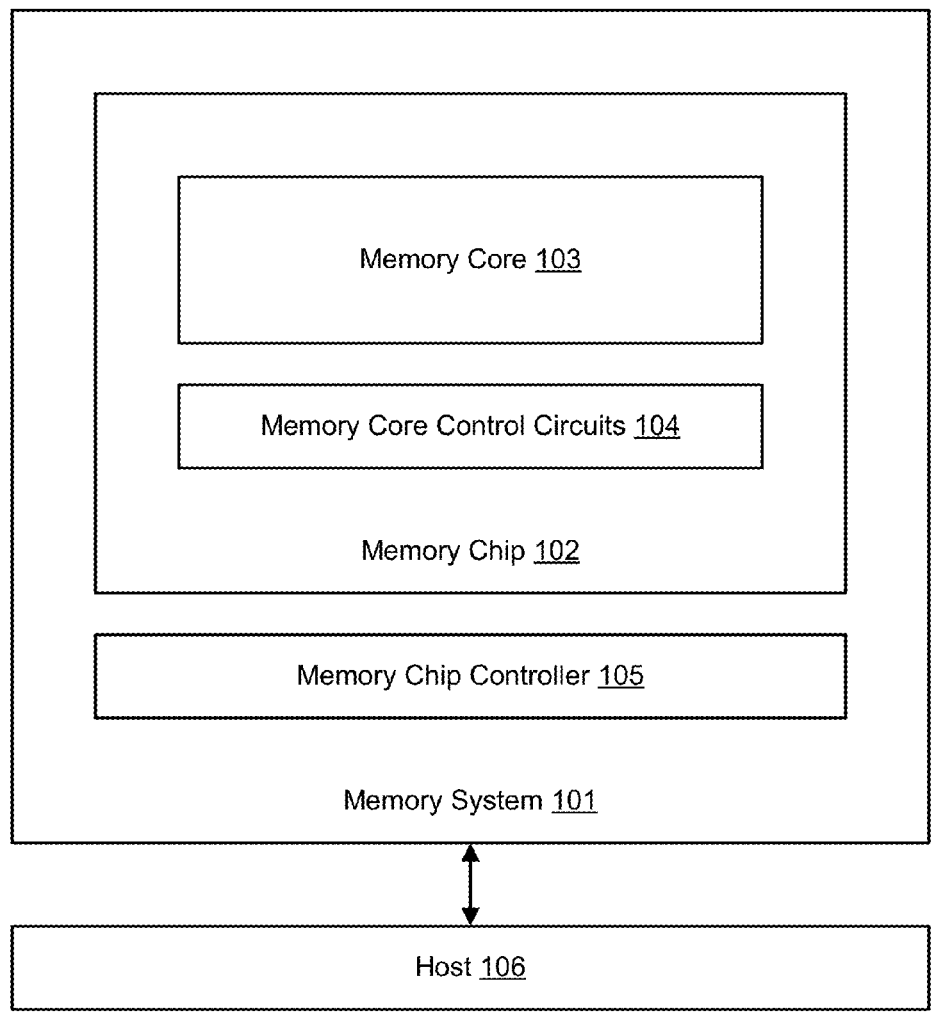
FIGS. 1A-1E depict various embodiments of a memory system.

Technology is described for reducing semiconductor memory die area while maintaining sensing margins for semiconductor memory cells using stacked vertical memory array architectures. In some embodiments, a first NAND string may be formed or arranged above a second NAND string. The first NAND string may include a first drain-side select gate connected to a first set of memory cell transistors (e.g., floating gate transistors or charge trap transistors) connected to a first source-side select gate. The second NAND string may include a second drain-side select gate connected to a second set of memory cell transistors connected to a second source-side select gate. The first NAND string and the second NAND string may comprise vertical NAND strings that are arranged orthogonal to a substrate (e.g., a silicon substrate). The first NAND string and the second NAND string may comprise portions of different memory array architectures (e.g., the first NAND string may be part of a first memory array that comprises U-shaped NAND strings and the second NAND string may be part of a second memory array that comprises single vertical NAND strings). The string lengths of the first NAND string and the second NAND string may be different or the same (e.g., the first NAND string may comprise 16 memory cell transistors in series and the second NAND string may comprise 32 memory cell transistors in series). In some cases, the string length for each of the NAND strings within a memory array may be limited by the amount of string current that may be provided by the NAND strings during a sensing operation (e.g., the string current for a string that is too long may be too weak to be sensed over various operating conditions or over a particular range of process, voltage, and/or temperature variations). The string length may also be limited by the maximum number of layers that may be reliably formed and/or limitations to the thickness of the hard mask that is consumed during memory hole (MH) etching for the vertical NAND strings.

In one embodiment, a first source line connected to a source of the first source-side select gate may be shorted (or electrically connected) to a second source line connected to a source of the second source-side select gate and a first set of word lines connected to gates of the first set of memory cell transistors may also be shorted to a second set of word lines connected to gates of the second set of memory cell transistors. A short between two conductors (e.g., between two metal lines) may be created via a physical short between the two conductors. The physical short may comprise a low resistance conductor (e.g., a metal wire) that may create a low electrical resistance path (e.g., less than 10 ohms) between the two conductors. In this case, a first bit line connected to a drain of the first drain-side select gate may not be shorted (or electrically connected) to a second bit line connected to a drain of the second drain-side select gate. The first bit line may be electrically connected to a first sense amplifier and the second bit line may be electrically connected to a second sense amplifier during a memory operation (e.g., a read operation or a program verify operation). In some cases, a gate of the first drain-side select gate may be shorted to a gate of the second drain-side select gate and a gate of the first source-side select gate may be shorted to a gate of the second source-side select gate.

In another embodiment, a first source line connected to a source of the first source-side select gate may be shorted to a second source line connected to a source of the second source-side select gate, a first set of word lines connected to gates of the first set of memory cell transistors may also be shorted to a second set of word lines connected to gates of the second set of memory cell transistors, and a first bit line connected to a drain of the first drain-side select gate may be shorted to a second bit line connected to a drain of the second drain-side select gate. In this case, a first drain-side select line connected to a gate of the first drain-side select gate may not be shorted (or electrically connected) to a second drain-side select line connected to a gate of the second drain-side select gate. The first drain-side select line and the second drain-side select line may be used to provide selectively to memory cells of the first NAND string and the second NAND string even though the first bit line is shorted to the second bit line and the gates of the first set of memory cell transistors are shorted to the gates of the second set of memory cell transistors. In one example, the first drain-side select line may set the first drain-side select gate into a conducting state while the second drain-side select line may set the second drain-side select gate into a non-conducting state during a memory operation.

In another embodiment, a first source line connected to a source of the first source-side select gate may be shorted to a second source line connected to a source of the second source-side select gate, and a first bit line connected to a drain of the first drain-side select gate may be shorted to a second bit line connected to a drain of the second drain-side select gate. In this case, a first set of word lines connected to gates of the first set of memory cell transistors may not be shorted to gates of the second set of memory cell transistors. A first set of word line drivers may drive or set the first set of word lines and a second set of word line drivers may drive or set a second set of word lines connected to the gates of the second set of memory cell transistors. In some cases, the first set of word line drivers may be fabricated above or arranged above the second set of word line drivers. In some cases, a gate of the first drain-side select gate may be shorted to a gate of the second drain-side select gate and a gate of the first source-side select gate may be shorted to a gate of the second source-side select gate.

In another embodiment, a first source line connected to a source of the first source-side select gate may not be shorted to a second source line connected to a source of the second source-side select gate, a first set of word lines connected to gates of the first set of memory cell transistors may or may not be shorted to a second set of word lines connected to gates of the second set of memory cell transistors, and a first bit line connected to a drain of the first drain-side select gate may or may not be shorted to a second bit line connected to a drain of the second drain-side select gate.

In another embodiment, a first source line connected to a source of the first source-side select gate may be shorted to a second source line connected to a source of the second source-side select gate, a first set of word lines connected to gates of the first set of memory cell transistors may not be shorted to a second set of word lines connected to gates of the second set of memory cell transistors, a first bit line connected to a drain of the first drain-side select gate may not be shorted to a second bit line connected to a drain of the second drain-side select gate, a gate of the first drain-side select gate may not be shorted to a gate of the second drain-side select gate, and a gate of the first source-side select gate may not be shorted to a gate of the second source-side select gate. Thus, in some cases, only the source lines may be shorted between the first NAND string and the second NAND string arranged below the first NAND string.

In some cases, the NAND structure used for implementing the first NAND string arranged above the second NAND string may be the same as or different from the NAND structure used for implementing the second NAND string. In one example, the first NAND string may comprise a U-shaped NAND string and the second NAND string may also comprise a U-shaped NAND string. In another example, the first NAND string may comprise a U-shaped NAND string and the second NAND string may comprise a single vertical NAND string. In another example, the first NAND string may comprise a single vertical NAND string and the second NAND string may comprise a U-shaped NAND string. A NAND structure may comprise a single string vertical Bit Cost Scalable (BiCS) NAND structure or a pipe-shaped (or U-shaped) BiCS NAND structure (p-BiCS).

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 2-5 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate. The memory array may comprise various memory structures including planar NAND structures, vertical NAND structures, Bit Cost Scalable (BiCS) NAND structures, 3D NAND structures, or 3D ReRAM structures.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading and/or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., a single-crystal substrate or a crystalline silicon substrate). In one example, the active area may include a semiconductor junction (e.g., a P—N junction). The active area may include a portion of a source or drain region of a transistor. In another example, the active area may include a channel region of a transistor.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) memory cells. In other cases, the re-writeable non-volatile memory cells may comprise conductive bridge memory cells or programmable metallization memory cells.

FIG. 1A depicts one embodiment of a memory system 101 and a host 106. The memory system 101 may comprise a non-volatile storage system interfacing with the host (e.g., a mobile computing device or a server). In some cases, the memory system 101 may be embedded within the host 106. As examples, the memory system 101 may comprise a memory card, a solid-state drive (SSD) such a high density MLC SSD (e.g., 2-bits/cell or 3-bits/cell) or a high performance SLC SSD, or a hybrid HDD/SSD drive. As depicted, the memory system 101 includes a memory chip controller 105 and a memory chip 102. The memory chip 102 may include volatile memory and/or non-volatile memory. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit or arranged on a single die. In other embodiments, the memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. In one embodiment, the memory core control circuits 104 and memory core 103 may be arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 may send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

Referring to FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array within the memory core 103. The one or more managing or control circuits may provide control signals to a memory array in order to perform a read operation and/or a write operation on the memory array. In one example, the one or more managing or control circuits may include any one of or a combination of control circuitry, state machines, decoders, sense amplifiers, read/write circuits, and/or controllers. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Figure 1B:
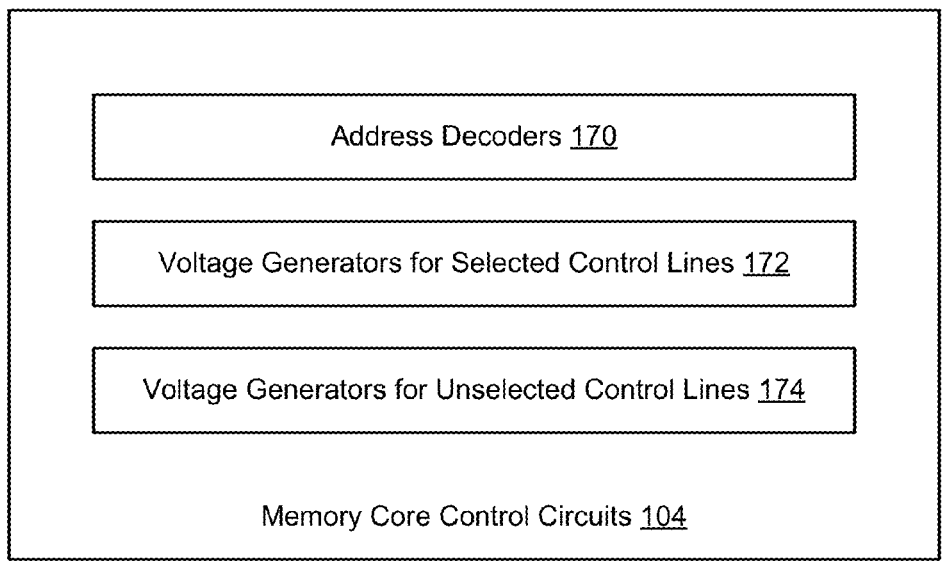

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

Figure 1C:
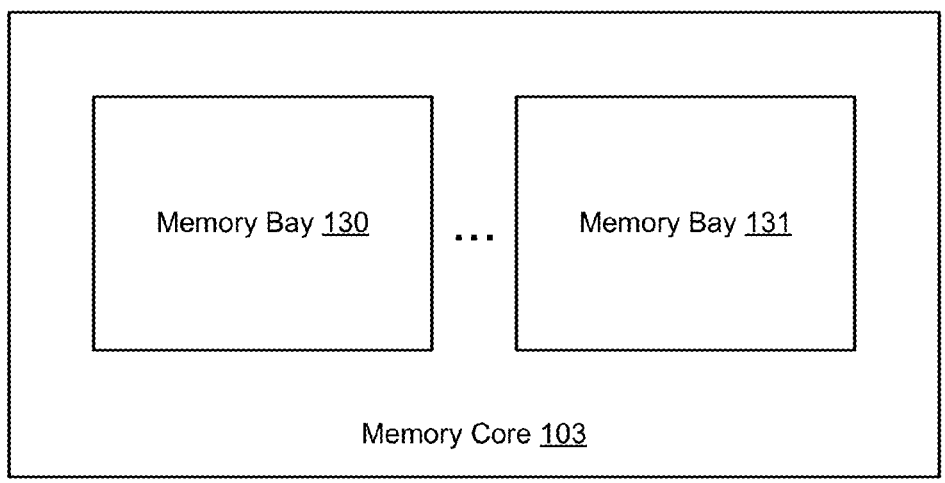

FIG. 1C depicts one embodiment of memory core 103 in FIG. 1A. As depicted, memory core 103 includes memory bay 130 and memory bay 131. In some embodiments, the number of memory bays per memory core can be different for different implementations. For example, a memory core may include only a single memory bay or a plurality of memory bays (e.g., 16 memory bays or 256 memory bays).

Figure 1D:
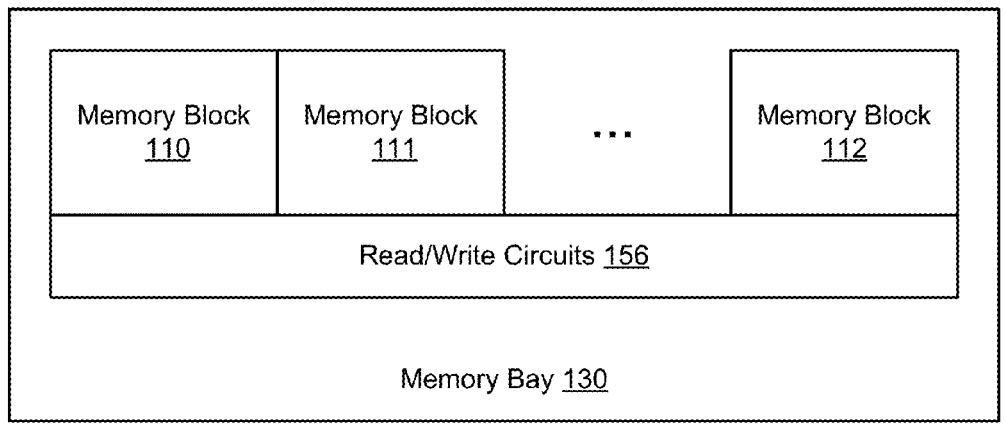

FIG. 1D depicts one embodiment of memory bay 130 in FIG. 1C. As depicted, memory bay 130 includes memory blocks 110-112 and read/write circuits 156. In some embodiments, the number of memory blocks per memory bay may be different for different implementations. For example, a memory bay may include one or more memory blocks (e.g., 32 memory blocks per memory bay). Read/write circuits 156 include circuitry for reading and writing memory cells within memory blocks 110-112. As depicted, the read/write circuits 156 may be shared across multiple memory blocks within a memory bay. This allows chip area to be reduced since a single group of read/write circuits 156 may be used to support multiple memory blocks. However, in some embodiments, only a single memory block may be electrically coupled to read/write circuits 156 at a particular time to avoid signal conflicts.

In some embodiments, read/write circuits 156 may be used to write one or more pages of data into the memory blocks 110-112 (or into a subset of the memory blocks). The memory cells within the memory blocks 110-112 may permit direct over-writing of pages (i.e., data representing a page or a portion of a page may be written into the memory blocks 110-112 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address before performing a write operation to write the set of data to the target address. The memory system 101 may then determine whether a particular memory cell may stay at its current state (i.e., the memory cell is already at the correct state), needs to be set to a "0" state, or needs to be reset to a "1" state. The memory system 101 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells. A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V).

In some cases, read/write circuits 156 may be used to program a particular memory cell to be in one of three or more data/resistance states (i.e., the particular memory cell may comprise a multi-level memory cell). In one example, the read/write circuits 156 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 156 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

Figure 1E:
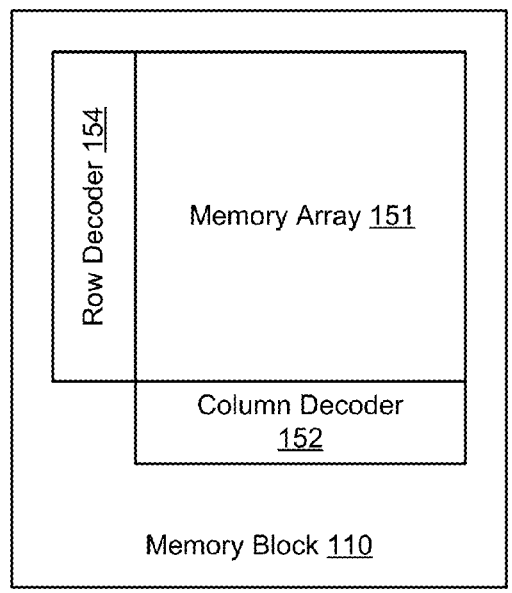

FIG. 1E depicts one embodiment of memory block 110 in FIG. 1D. As depicted, memory block 110 includes a memory array 151, row decoder 154, and column decoder 152. Memory array 151 may comprise a contiguous group of memory cells having contiguous word lines and bit lines. Memory array 151 may comprise one or more layers of memory cells. Memory array 151 may comprise a two-dimensional memory array or a three-dimensional memory array. The row decoder 154 decodes a row address and selects a particular word line in memory array 151 when appropriate (e.g., when reading or writing memory cells in memory array 151). The column decoder 152 decodes a column address and selects a particular group of bit lines in memory array 151 to be electrically coupled to read/write circuits, such as read/write circuits 156 in FIG. 1D. In one embodiment, the number of word lines is 4K per memory layer, the number of bit lines is 1K per memory layer, and the number of memory layers is 4, providing a memory array 151 containing 16M memory cells.

In one embodiment, memory array 151 may comprise memory cells that are oriented in a horizontal plane that is horizontal to the supporting substrate. In another embodiment, memory array 151 may comprise memory cells that are oriented in a vertical plane that is vertical with respect to the supporting substrate (i.e., the vertical plane is perpendicular to the supporting substrate). In this case, the bit lines of memory array 151 may comprise vertical bit lines.

Figure 2A:
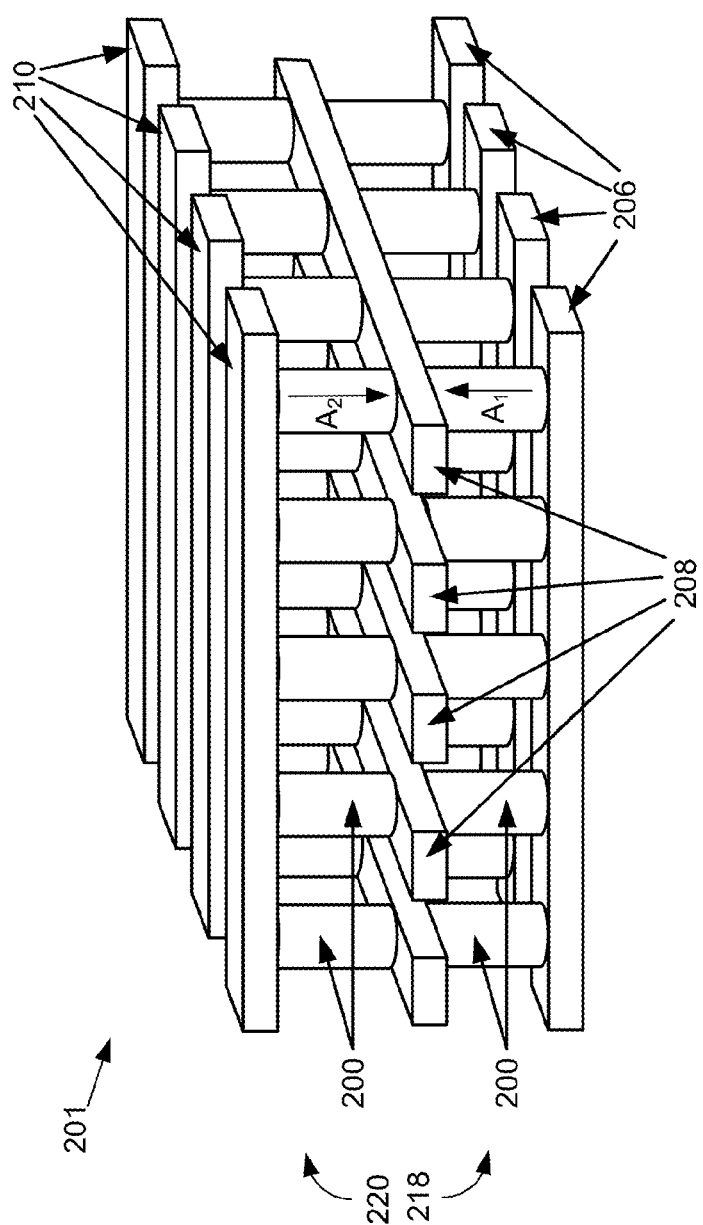
FIGS. 2A-2D depict various embodiments of a cross-point memory array.

FIG. 2A depicts one embodiment of a portion of a monolithic three-dimensional memory array 201 that includes a second memory level 220 positioned above a first memory level 218. Memory array 201 is one example of an implementation for memory array 151 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 2A, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes a state change element and does not include a steering element. The absence of a diode (or other steering element) from a memory cell may reduce the process complexity and costs associated with manufacturing a memory array.

In one embodiment, the memory cells 200 of FIG. 2A may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) devices.

In another embodiment, the memory cells 200 of FIG. 2A may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Referring to FIG. 2A, in one embodiment of a read operation, the data stored in one of the plurality of memory cells 200 may be read by biasing one of the word lines (i.e., the selected word line) to a selected word line voltage in read mode (e.g., 0V). A read circuit may then be used to bias a selected bit line connected to the selected memory cell to the selected bit line voltage in read mode (e.g., 1.0V). In some cases, in order to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V); however, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line. The leakage current may be subtracted out by using the auto zero current sensing.

Referring to FIG. 2A, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current (s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "1" and the low-resistivity state may be associated with binary data "0." In other embodiments, SETTING and RESETTING operations and/or the data encoding may be reversed. For example, the high-resistivity state may be associated with binary data "0" and the low-resistivity state may be associated with binary data "1." In some embodiments, a higher than normal programming voltage may be required the first time a reversible resistance-switching element is SET into the low-resistivity state as the reversible resistance-switching element may have been placed into a resistance state that is higher than the high-resistivity state when fabricated. The term "FORMING" may refer to the setting of a reversible resistance-switching element into a low-resistivity state for the first time after fabrication or the resetting of a reversible resistance-switching element into a high-resistivity state for the first time after fabrication. In some cases, after a FORMING operation or a memory cell preconditioning operation has been performed, the reversible resistance-switching element may be RESET to the high-resistivity state and then SET again to the low-resistivity state.

Referring to FIG. 2A, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 2B:
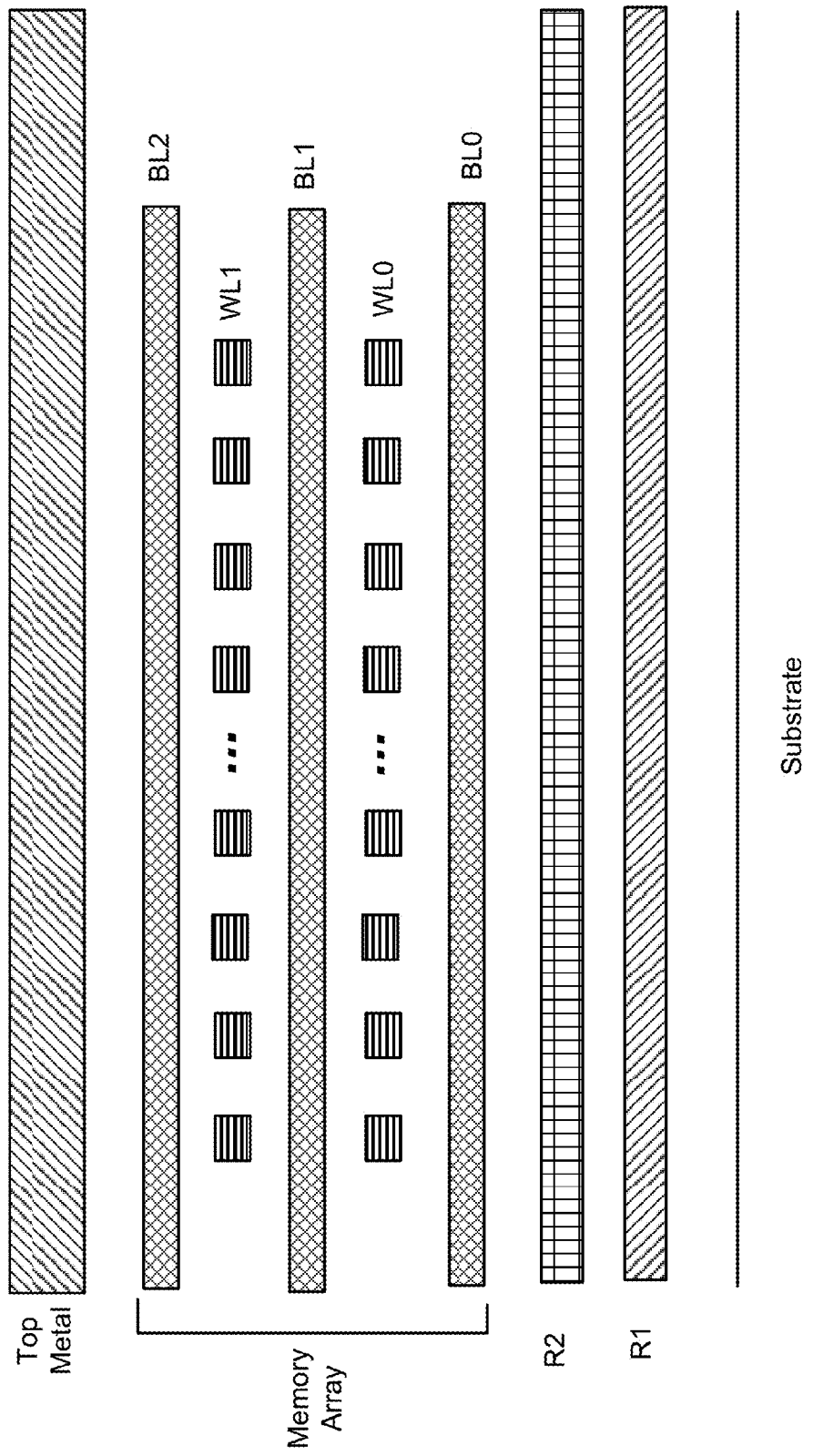

FIG. 2B depicts a subset of the memory array and routing layers of one embodiment of a three-dimensional memory array, such as memory array 151 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 2B, two metal layers R1 and R2 may be used for routing layers; however, other embodiments can include more or less than two metal layers. In one example, these metal layers R1 and R2 may be formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 2C:
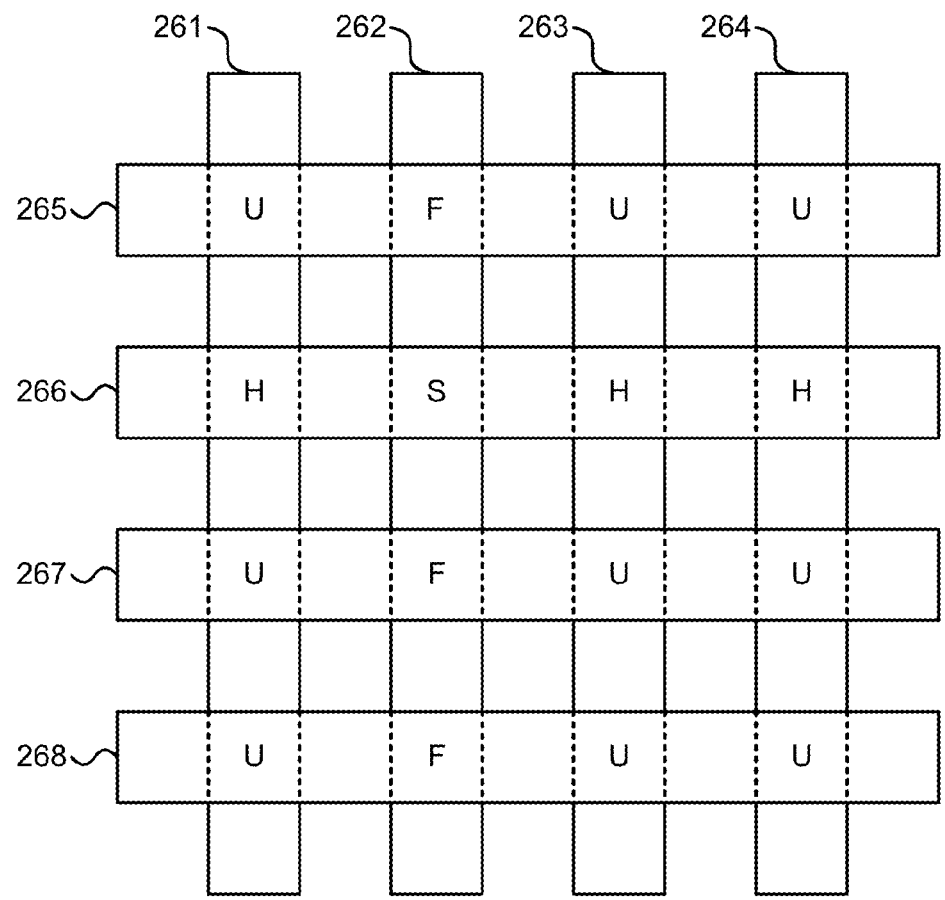

FIG. 2C depicts one embodiment of a cross-point memory array 260. In one example, the cross-point memory array 260 may correspond with memory array 201 in FIG. 2A. As depicted, cross-point memory array 260 includes word lines 265-268 and bit lines 261-264. The bit line 261 may comprise a vertical bit line or horizontal bit line. Word line 266 comprises a selected word line and bit line 262 comprises a selected bit line. At the intersection of selected word line 266 and selected bit line 262 is a selected memory cell (an S cell). The voltage across the S cell is the difference between the selected word line voltage and the selected bit line voltage. Memory cells at the intersections of the selected word line 266 and the unselected bit lines 261, 263, and 264 comprise unselected memory cells (H cells). H cells are unselected memory cells that share a selected word line that is biased to the selected word line voltage. The voltage across the H cells is the difference between the selected word line voltage and the unselected bit line voltage. Memory cells at the intersections of the selected bit line 262 and the unselected word lines 265, 267, and 268 comprise unselected memory cells (F cells). F cells are unselected memory cells that share a selected bit line that is biased to a selected bit line voltage. The voltage across the F cells is the difference between the unselected word line voltage and the selected bit line voltage. Memory cells at the intersections of the unselected word lines 265, 267, and 268 and the unselected bit lines 261, 263, and 264 comprise unselected memory cells (U cells). The voltage across the U cells is the difference between the unselected word line voltage and the unselected bit line voltage.

The number of F cells is related to the length of the bit lines (or the number of memory cells connected to a bit line) while the number of H cells is related to the length of the word lines (or the number of memory cells connected to a word line). The number of U cells is related to the product of the word line length and the bit line length. In one embodiment, each memory cell sharing a particular word line, such as word line 265, may be associated with a particular page stored within the cross-point memory array 260.

Figure 2D:
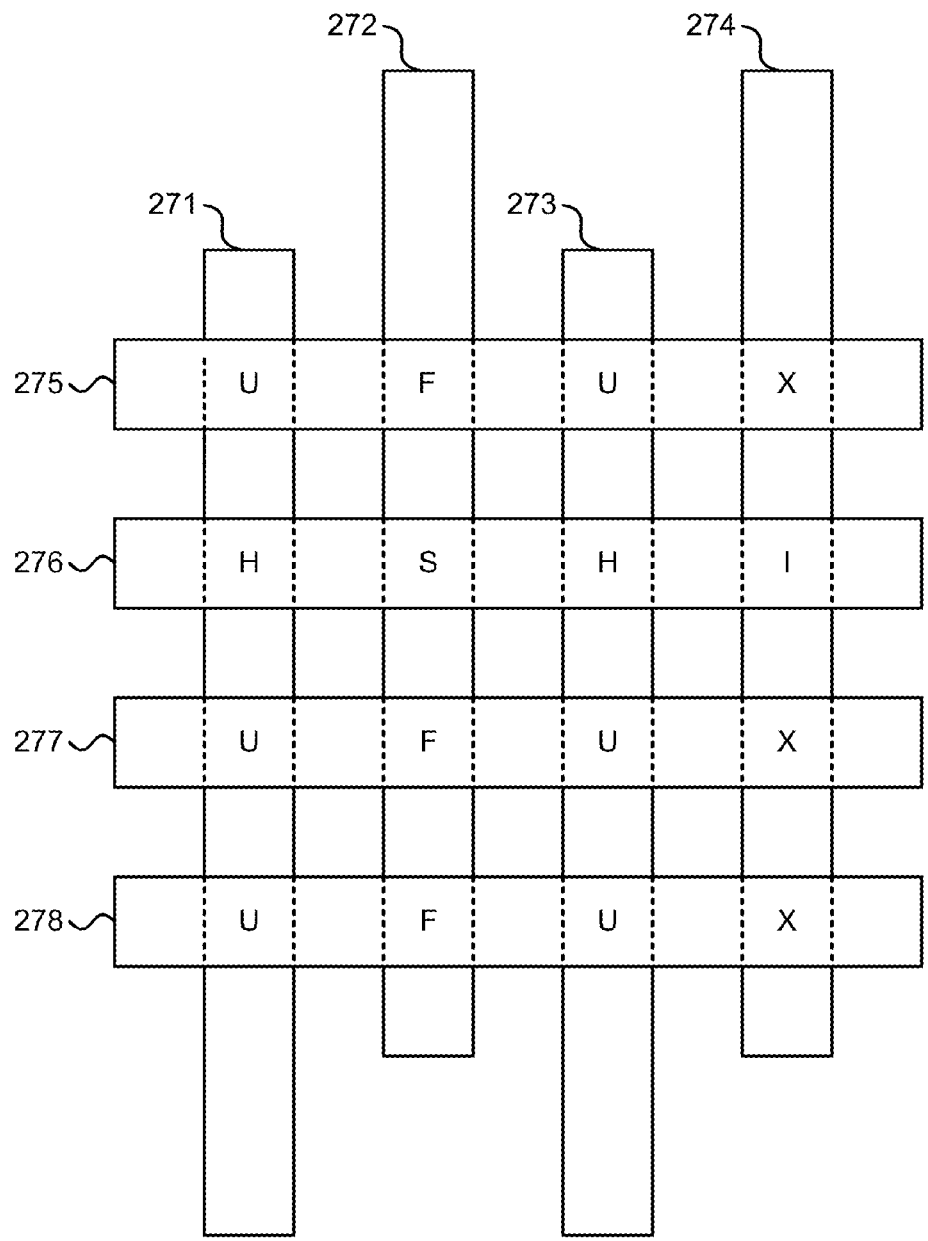

FIG. 2D depicts an alternative embodiment of a cross-point memory array 270. In one example, the cross-point memory array 270 may correspond with memory array 201 in FIG. 2A. As depicted, cross-point memory array 270 includes word lines 275-278 and bit lines 271-274. The bit line 271 may comprise a vertical bit line or horizontal bit line. Word line 276 comprises a selected word line and bit lines 272 and 274 comprise selected bit lines. Although both bit lines 272 and 274 are selected, the voltages applied to bit line 272 and bit line 274 may be different. For example, in the case that bit line 272 is associated with a first memory cell to be programmed (i.e., an S cell), then bit line 272 may be biased to a selected bit line voltage in order to program the first memory cell. In the case that bit line 274 is associated with a second memory cell that is not to be programmed (i.e., an I cell), then bit line 274 may be biased to a program inhibit voltage (i.e., to a bit line voltage that will prevent the second memory cell from being programmed).

At the intersection of selected word line 276 and selected bit line 274 is a program inhibited memory cell (an I cell). The voltage across the I cell is the difference between the selected word line voltage and the program inhibit voltage. Memory cells at the intersections of the selected bit line 274 and the unselected word lines 275, 277, and 278 comprise unselected memory cells (X cells). X cells are unselected memory cells that share a selected bit line that is biased to a program inhibit voltage. The voltage across the X cells is the difference between the unselected word line voltage and the program inhibit voltage. In one embodiment, the program inhibit voltage applied to the selected bit line 274 may be the same as or substantially the same as the unselected bit line voltage. In another embodiment, the program inhibit voltage may be a voltage that is greater than or less than the unselected bit line voltage. For example, the program inhibit voltage may be set to a voltage that is between the selected word line voltage and the unselected bit line voltage. In some cases, the program inhibit voltage applied may be a function of temperature. In one example, the program inhibit voltage may track the unselected bit line voltage over temperature.

In one embodiment, two or more pages may be associated with a particular word line. In one example, word line 275 may be associated with a first page and a second page. The first page may correspond with bit lines 271 and 273 and the second page may correspond with bit lines 272 and 274. In this case, the first page and the second page may correspond with interdigitated memory cells that share the same word line. When a memory array operation is being performed on the first page (e.g., a programming operation) and the selected word line 276 is biased to the selected word line voltage, one or more other pages also associated with the selected word line 276 may comprise H cells because the memory cells associated with the one or more other pages will share the same selected word line as the first page.

In some embodiments, not all unselected bit lines may be driven to an unselected bit line voltage. Instead, a number of unselected bit lines may be floated and indirectly biased via the unselected word lines. In this case, the memory cells of memory array 270 may comprise resistive memory elements without isolating diodes. In one embodiment, the bit lines 272 and 273 may comprise vertical bit lines in a three dimensional memory array comprising comb shaped word lines.

Figure 3A:
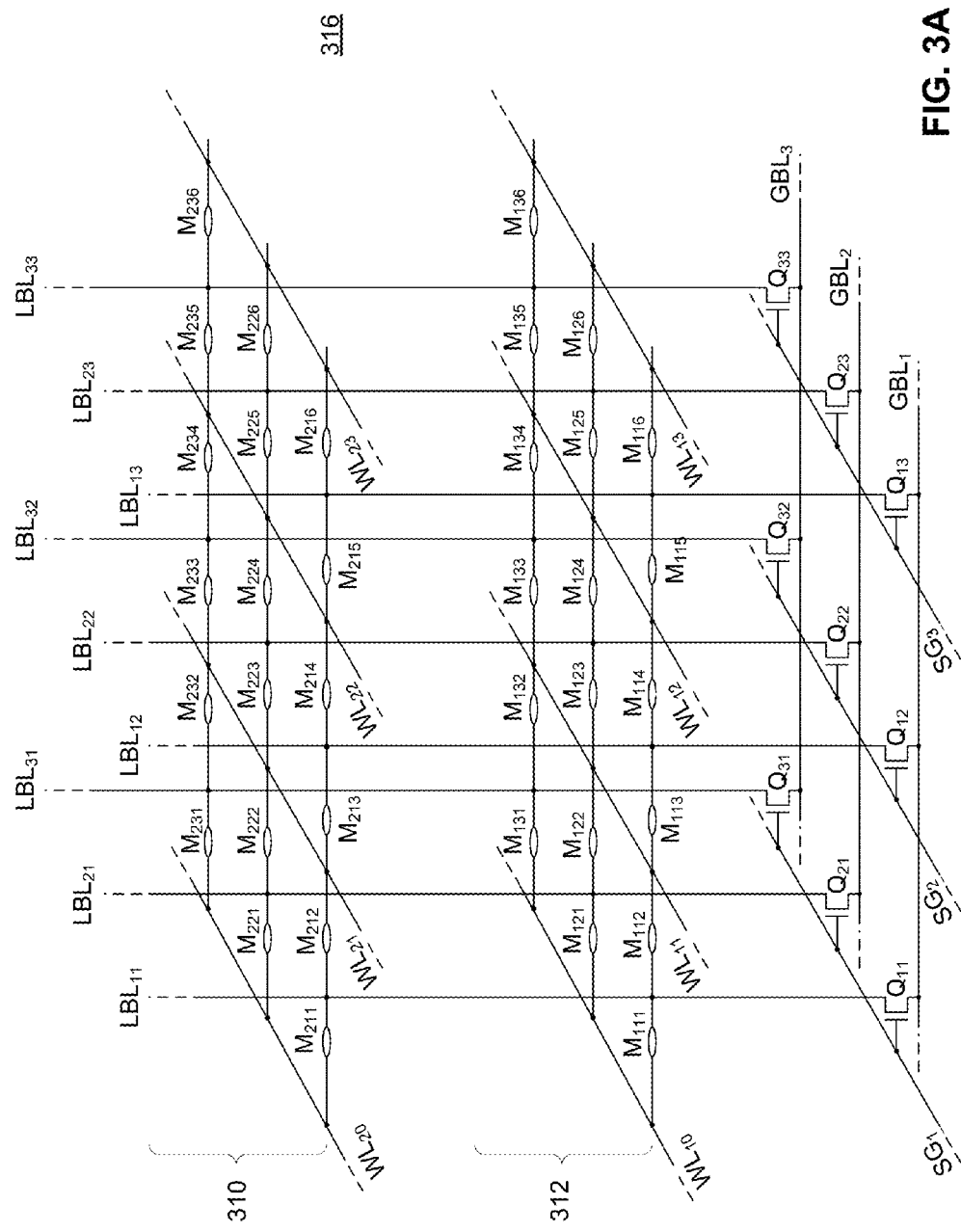

FIG. 3A depicts one embodiment of a portion of a monolithic three-dimensional memory array 316 that includes a first memory level 312 positioned below a second memory level 310. Memory array 316 is one example of an implementation for memory array 151 in FIG. 1E. As depicted, the local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). In one example, the particular memory cell may include a floating gate device or a charge trap device (e.g., using a silicon nitride material). In another example, the particular memory cell may include a reversible resistance-switching material, a metal oxide, a phase change material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 3A, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 316, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, while the number of memory cells along each word line may be 2048 or more than 4096.

Figure 3B:
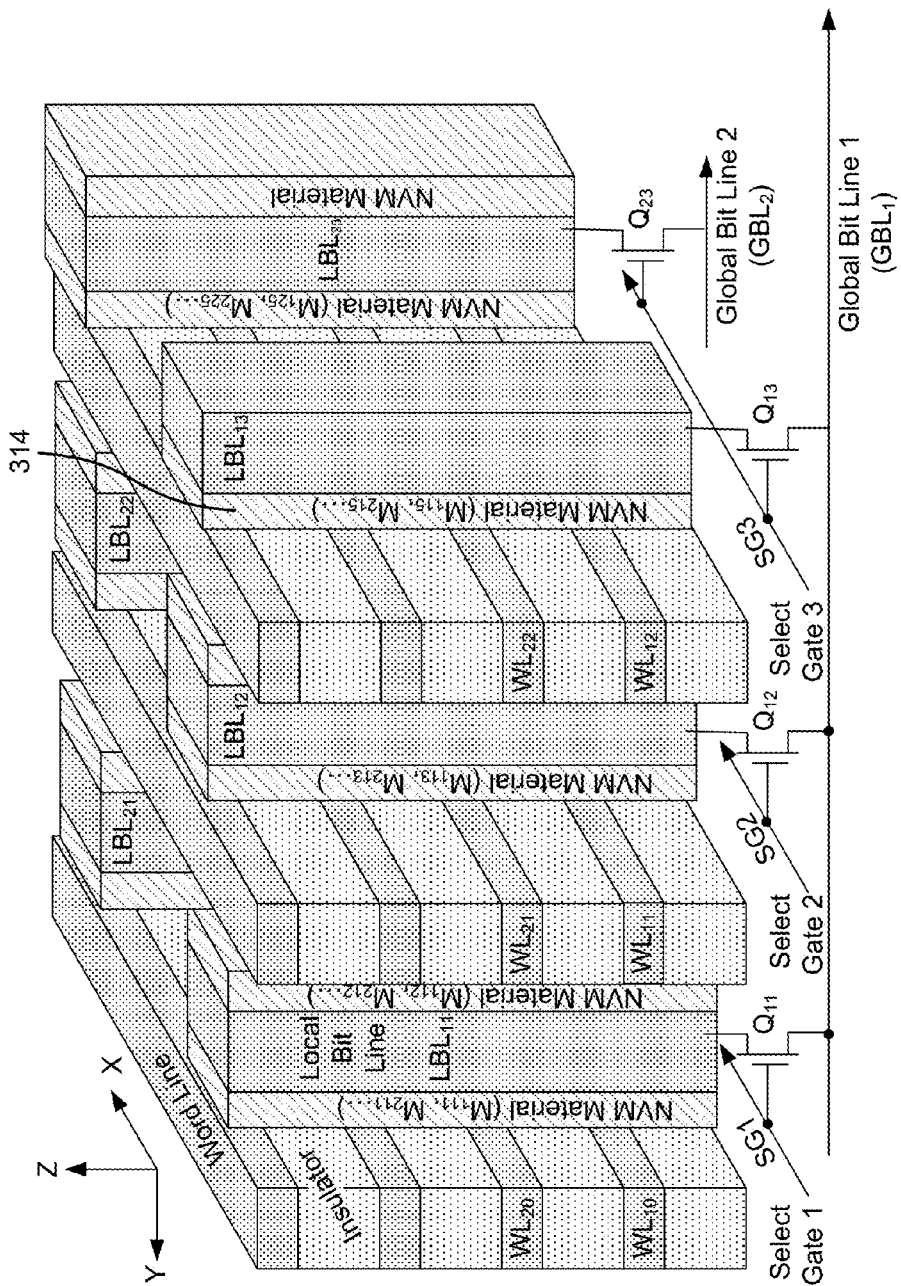

FIG. 3B depicts one embodiment of a portion of a monolithic three-dimensional memory array that includes vertical strips of a non-volatile memory material. The physical structure depicted in FIG. 3B may comprise one implementation for a portion of the monolithic three-dimensional memory array depicted in FIG. 3A. The vertical strips of non-volatile memory material may be formed in a direction that is perpendicular to a substrate (e.g., in the Z direction). A vertical strip of the non-volatile memory material 314 may include, for example, a vertical oxide layer, a vertical metal oxide layer (e.g., nickel oxide or hafnium oxide), a vertical layer of phase change material, or a vertical charge trapping layer (e.g., a layer of silicon nitride). The vertical strip of material may comprise a single continuous layer of material that may be used by a plurality of memory cells or devices. In one example, portions of the vertical strip of the non-volatile memory material 314 may comprise a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may comprise a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may comprise a MOS device (e.g., an NMOS device) or a vertical thin-film transistor (TFT).

FIG. 3C depicts a cross-sectional view of a memory structure using the vertically oriented select devices shown in FIG. 3B. The memory structure of FIG. 3C may comprise a continuous mesh array of memory elements because there are memory elements connected to both sides of the bit lines and memory elements connected to both sides of the word lines. At the bottom of FIG. 3C, a silicon substrate is depicted. Implemented above the surface of the silicon substrate are various metal lines including ML-0, ML-1, and ML-2. Line 526 of ML-2 serves as a respective global bit line (GBL). The Pillar Select Layer includes two oxide layers 520 with a gate material layer 522 sandwiched therebetween. The oxide layers 520 can be $SiO_2$. The metal line ML-2 526 serving as a global bit line can be implemented of any suitable material, including Tungsten, or Tungsten on a Titanium Nitride adhesion layer or a sandwich of n+ polysilicon on Tungsten on Titanium Nitride adhesion layer. Gate material 522 can be polysilicon, Titanium Nitride, Tantalum Nitride, Nickel Silicide or any other suitable material. Gate material 522 implements the row select lines SG$_x$ (e.g. SG$_1$, SG$_2$, . . . of FIG. 3B), which are labeled in FIG. 3C as row select lines 580, 582, 584, 586, 588 and 590.

The memory layer includes a set of vertical bit lines 530 (comprising N+ polysilicon). Interspersed between the vertical bit lines 530 are alternating oxide layers 534 and word line layers 536. In one embodiment, the word lines are made from TiN. Between the vertical bit lines 530 and the stacks of alternating oxide layers 536 and word line layers 536 are vertically oriented layers of reversible resistance switching material 532. In one embodiment the reversible resistance switching material is made of Hafnium Oxide HfO$_2$. In another embodiment, the reversible resistance switching material 532 may include a layer of amorphous silicon (e.g., a Si barrier layer) and a layer titanium oxide (e.g., a TiO2 switching layer). Box 540 depicts one example memory element which includes the reversible resistance switching material 532 sandwiched between a word line 536 and vertical bit line 530. Directly below each vertical bit line 530 are the vertically oriented select devices 504, each of which comprises (in one example embodiment) a n+/p−/n+ TFT. Each of the vertically oriented select devices 504 have oxide layers 505 on each side. FIG. 3C also shows an n+ polysilicon layer 524. As depicted, the npn TFT of vertically oriented select devices 504 can be used to connect the global bit line GBL (layer 526) with any of the vertical bit lines 530.

Moreover, FIG. 3C shows six row select lines (SG$_x$) 580, 582, 584, 586, 588 and 590 in the gate material layer 522, each underneath a stack of multiple word lines. Each of the row select lines 580, 582, 584, 586, 588 and 590 is positioned between two vertically oriented select devices 504, above and not in the substrate. Each row select line may serve as the gate signal to either of the two neighboring vertically oriented select devices 504; therefore, the vertically oriented select devices 504 are said to be double gated. Each vertically oriented select device 504 can be controlled by two different row select lines, in this embodiment. One aspect of the vertically oriented select devices incorporated to the base portion of each bit line pillar is that two adjacent vertically oriented select devices share the same gate region, which may allow the vertically oriented select devices to be closer together.

In some embodiments, a portion of a memory array may be formed by first etching through an alternating stack of word line layers and dielectric layers (e.g., etching through layers of TiN or polysilicon that are separated by oxide layers) to form a plurality of memory holes. The plurality of memory holes may comprise rectangular, square, or cylindrical holes. The plurality of memory holes may be formed by patterning and then removing material using various etching techniques such as dry etching, wet chemical etching, plasma etching, or reactive-ion etching (RIE). After the plurality of memory holes have been created, the layers for forming vertical pillars within the plurality of memory holes may be deposited. The layers of the vertical pillars may be deposited using various deposition techniques such as chemical vapor deposition (CVD), physical vapor deposition (PVD), or atomic layer deposition (ALD).

Figure 4A:
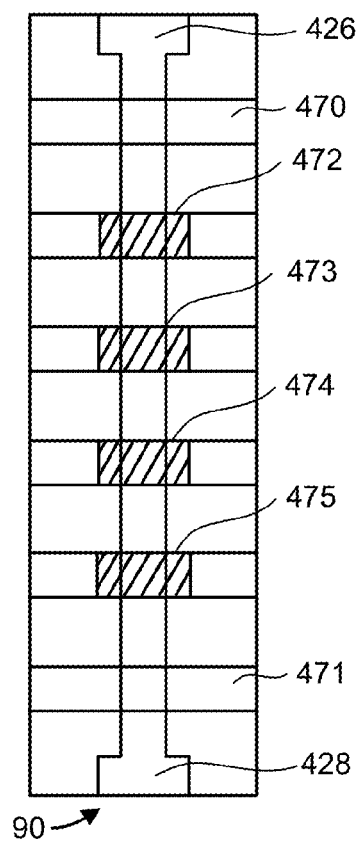
FIG. 4A depicts one embodiment of a NAND string.
Figure 4B:
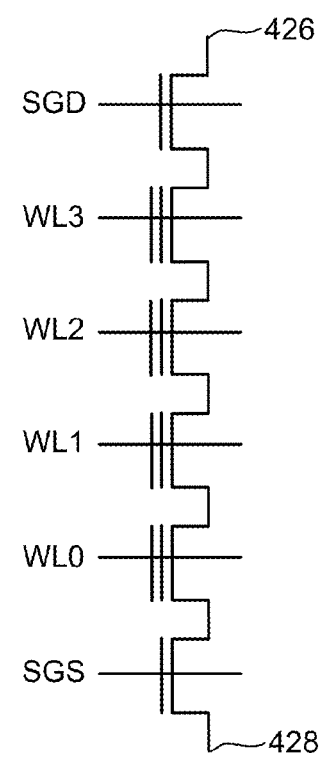
FIG. 4B depicts one embodiment of the NAND string of FIG. 4A using a corresponding circuit diagram.

FIG. 4A depicts one embodiment of a NAND string 90. FIG. 4B depicts one embodiment of the NAND string of FIG. 4A using a corresponding circuit diagram. As depicted, NAND string 90 includes four transistors 472-475 in series between a first select gate 470 (i.e., a drain-side select gate) and a second select gate 471 (i.e., a source-side select gate). Select gate 470 connects the NAND string 90 to a bit line 426 and is controlled by applying the appropriate voltage to the select line SGD. In this case, the bit line 426 is directly connected to the drain side end of the NAND string. Select gate 471 connects the NAND string 90 to a source line 428 and is controlled by applying the appropriate voltage to the select line SGS. In this case, the source line 428 is directly connected to the source-side end of the NAND string 90. The gates of transistors 472-475 are connected to word lines WL3, WL2, WL1, and WL0, respectively.

Note that although FIGS. 4A-4B show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND flash memory structure includes a plurality of NAND strings within a memory block. A memory block may comprise a unit of erase. In some cases, the NAND strings within a memory block may share a common well (e.g., a p-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation.

Although technology using NAND-type flash memory may be described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

Figure 4C:
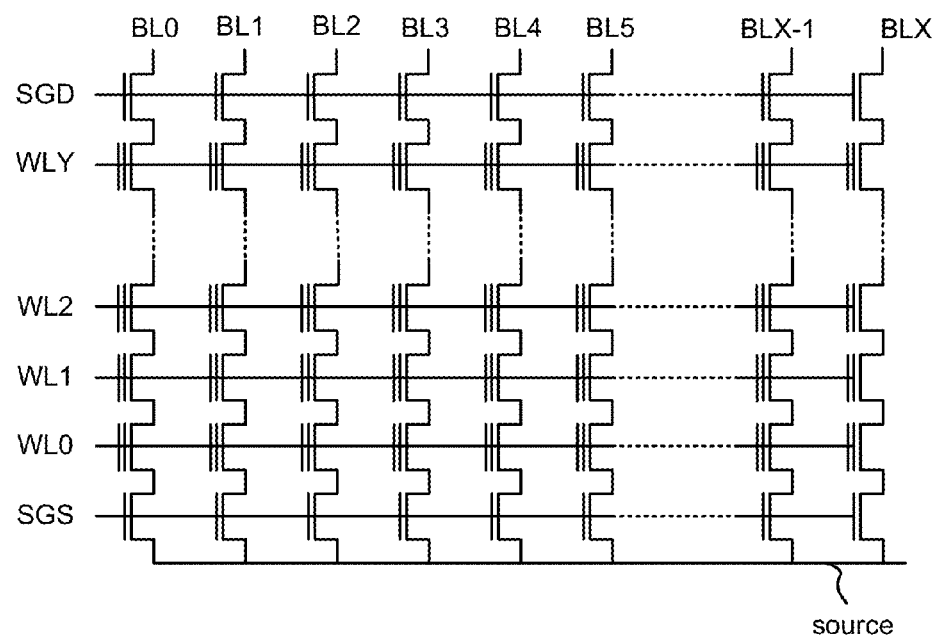
FIG. 4C depicts one embodiment of a memory block including a plurality of NAND strings.

FIG. 4C depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may comprise transistors without floating gates or transistors that include a floating gate structure.

In one embodiment, during a programming operation, when programming a memory cell, such as a NAND flash memory cell, a program voltage may be applied to the control gate of the memory cell and the corresponding bit line may be grounded. These programming bias conditions may cause electrons to be injected into the floating gate via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed. During the programming operation, memory cells that have reached their intended programming states may be locked out and inhibited from programming by boosting the channel regions of the program inhibited memory cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are several ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

In some cases, during a read operation or a sensing operation, the source-side selection signal SGS may be set to a particular voltage (e.g., 7V or 10V) to pass the voltage applied to the source line (source) to the source junction of the floating gate transistors whose gates are connected to WL0 or the word line closest to the source-side select gate.

Figure 4D:
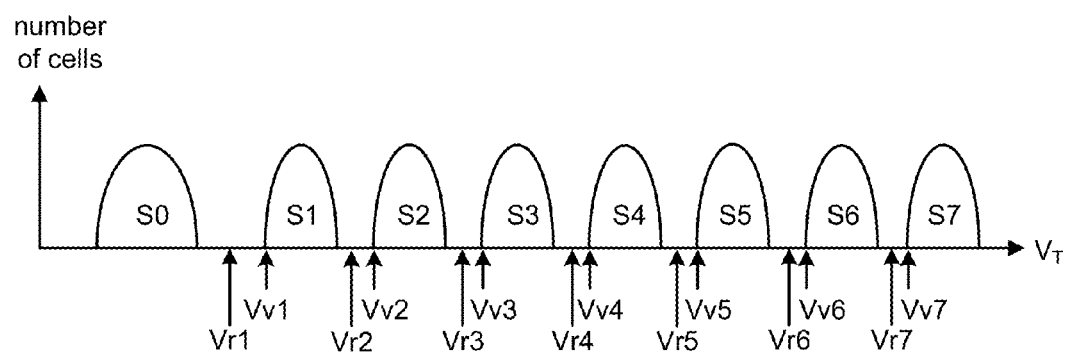
FIG. 4D depicts one embodiment of possible threshold voltage distributions for a three-bit-per-cell memory cell.

FIG. 4D depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 4F:
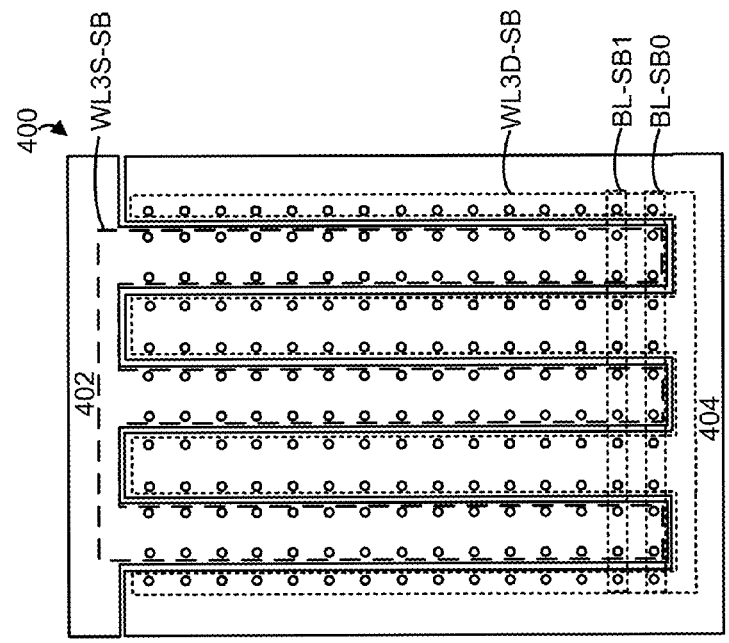
FIGS. 4E-4J depict various embodiments of NAND structures.
Figure 4E:
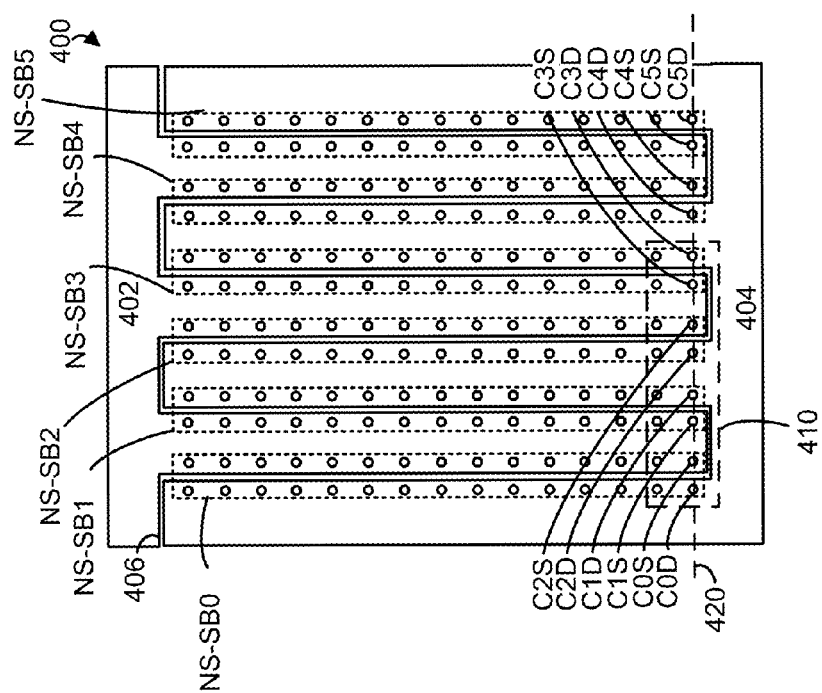

FIG. 4E depicts a top view of U-shaped NAND strings that are part of a memory block 400. The block 400 may include NAND string sub-blocks NS-SB0 to NS-SB5. Block 400 may comprise one example implementation of memory block 110 in FIG. 1D. The top view depicts a representative word line layer among multiple word line layers in a stack that includes alternating dielectric and conductive layers.

The conductive layers may include doped polysilicon or metal silicide and the dielectric layers may include silicon dioxide. The word line layer is divided into two portions (or planes) 402 and 404. Each word line layer portion can be considered to be a word line, and is connected to control gates of associated memory cells.

Each block includes a slit pattern. A slit may refer to a void which extends vertically in the stack, typically from an etch stop layer at the bottom to at least a top layer of the stack. A slit 406 is a single continuous slit which extends in a zig-zag pattern in the block so that the block is divided into the two portions 402 and 404 that are insulated from one another. This approach can provide greater flexibility in controlling the memory cells since the two word line layer portions can be driven independently at each layer or height in the stack. Each block includes rows of vertical memory holes or pillars, represented by circles. The memory holes extend vertically in the stack and include memory cells such as in a vertical NAND string. An example column of memory cells along a line 420 includes C0D to C5D (D denotes a drain side column and S denotes a source side column).

FIG. 4F depicts the block 400 in FIG. 4E showing example word line subsets WL3D-SB and WL3S-SB and example bit line subsets BL-SB0 and BL-SB1. WL3S-SB is a portion of a word line layer (e.g., the third word line layer) connected to one memory cell in the source-side of each U-shaped NAND string, and WL3D-SB is a portion of the word line layer connected to one memory cell in the drain-side of each U-shaped NAND string. When U-shaped NAND strings (or pipe-shaped NAND strings) are used, each NAND string sub-block can include two adjacent rows of columns of memory cells. In the sub-block, the adjacent rows are separated by the slit. The columns of memory cells on one side of the slit are drain-side columns (e.g., C0D, C1D, C2D and C3D in FIG. 4E) of NAND strings, and the columns of memory cells on the other side of the slit are source-side columns (e.g., C0S, C1S, C2S and C3S in FIG. 4E) of the NAND strings. Word line drivers can independently provide signals such as voltage waveforms to the word line layer portions 402 and 404.

Figure 4G:
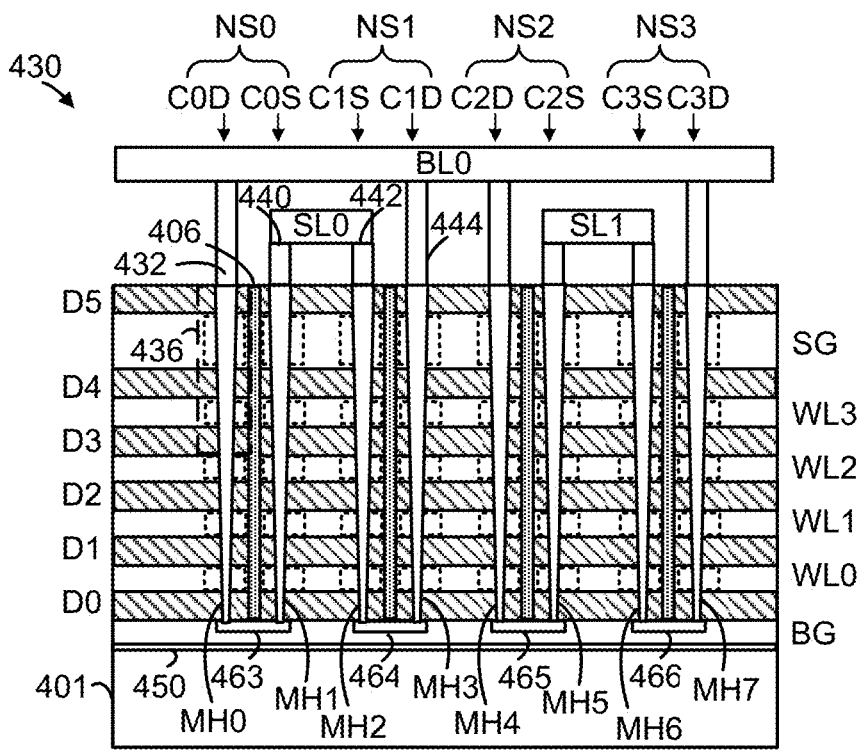

FIG. 4G depicts a cross-sectional view of the portion 410 of the block 400 of FIG. 4E along line 420. Columns of memory cells are depicted in the multi-layer stack. The portion 410 includes the substrate 401, an insulating film 450 on the substrate, and a back gate layer BG, which is a conductive layer on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 463 to 466 which connect the columns. The back gate connects the two columns of each U-shaped NAND string. For example, NS0 (NS=NAND string) includes columns C0D and C0S and connecting portion 463 and has a drain end 432 and a source end 440. NS1 includes columns C1S and CM and connecting portion 464 and has a drain end 444 and a source end 442. NS2 includes columns C2D and C2S and connecting portion 465. NS3 includes columns C3S and C3D and connecting portion 466. The source line SL0 is connected to the source ends 440 and 442 of two adjacent memory strings NS0 and NS1. Additional U-shaped NAND strings in the stack 430 may extend behind the U-shaped NAND strings depicted in the cross-section. The U-shaped NAND strings NS0-NS3 are each in a different NAND string sub-block, but are in a common BL subset. The bit line BL0 connects to the drain ends 432 and 444. Memory holes MH0-MH7 are depicted extending vertically in the stack and correspond with respective memory holes for the memory cells of the NAND strings.

Figure 4H:
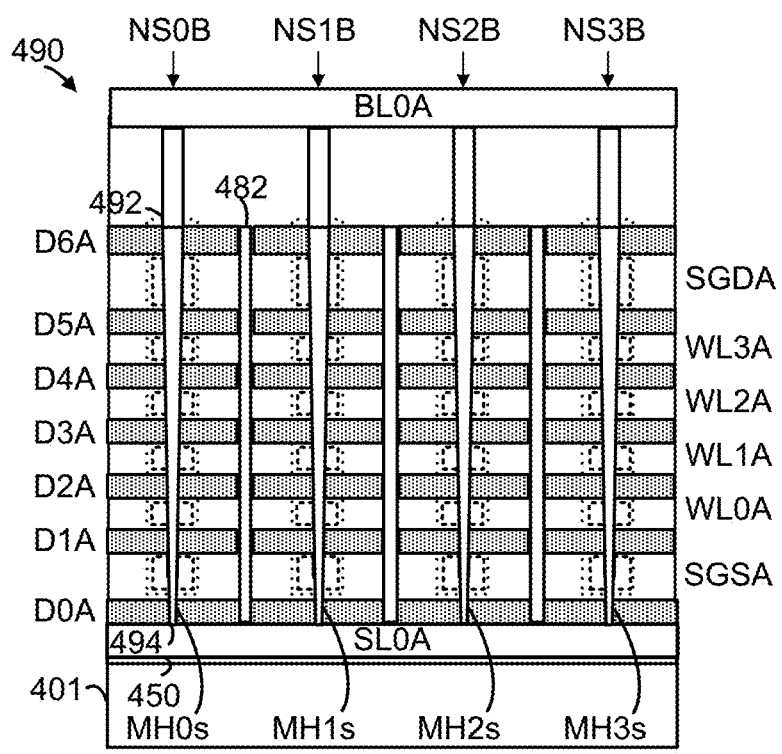
Figure 4I:
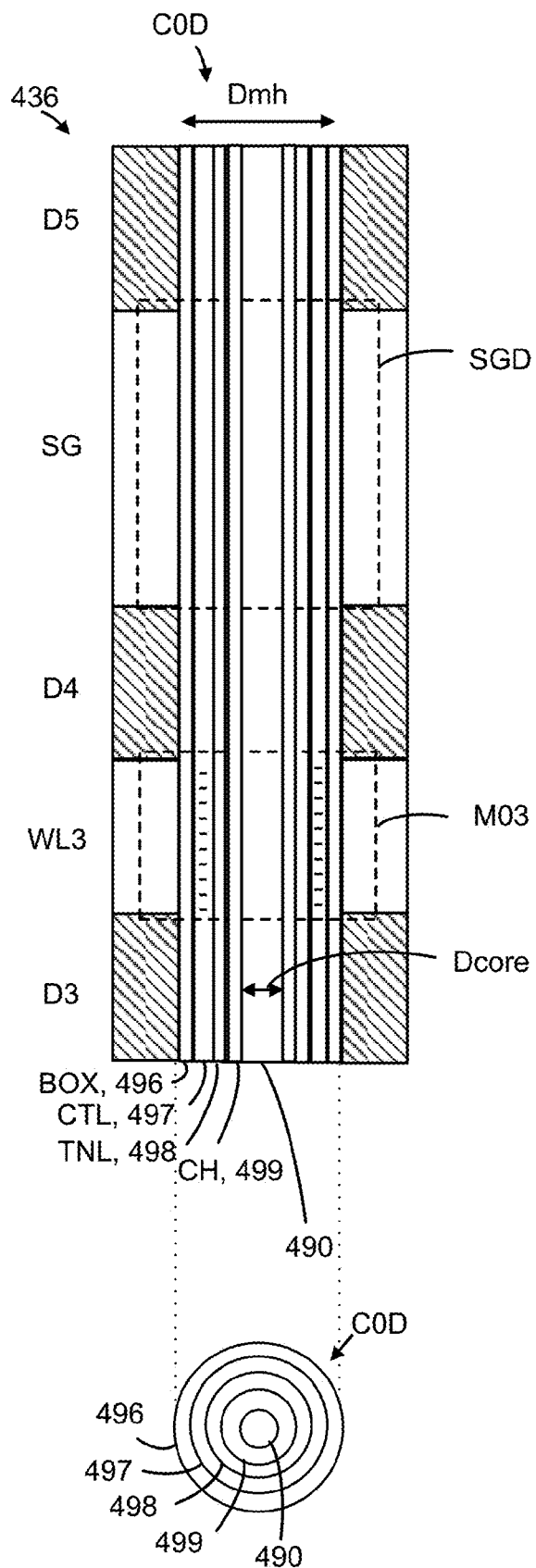

FIG. 4I depicts a close-up view of the region 436 of the column C0D of FIG. 4G, showing a drain-side select gate transistor SGD and a memory cell M03. The region also shows portions of the dielectric layers D3, D4 and D5. Each column includes a number of layers which are deposited along the sidewalls of the column. These layers can include oxide-nitride-oxide (O—N—O) and polysilicon layers which are deposited, e.g., using atomic layer deposition. For example, a block oxide (BOX) can be deposited as layer 496, a nitride such as SiN as a charge trapping layer (CTL) can be deposited as layer 497 and a tunnel oxide (TNL) can be deposited as layer 498, to provide the O—N—O layers. Further, a polysilicon body or channel (CH) can be deposited as layer 499, and a core filler dielectric can be deposited as region 490. Additional memory cells may be similarly formed throughout the columns. Dmh represents the memory hole diameter and Dcore represents the core diameter, which can both vary along the length or longitudinal axis of the memory hole. When a memory cell is programmed, electrons are stored in a portion of the charge trapping layer which is associated with the memory cell. For example, electrons are represented by "-" symbols in the CTL 497 for the memory cell M03.

Figure 4J:
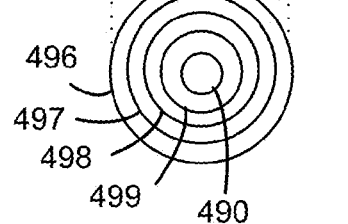

FIG. 4J depicts a cross-sectional view of the column C0D of FIG. 4I. In some cases, each layer may be ring-shaped except for the core filler, which may be a tapered cylinder.

FIG. 4H depicts a cross-sectional view of a single vertical NAND string architecture. As depicted, vertical strings of memory cells corresponding with NAND strings NS0B, NS1B, NS2B and NS3B are depicted in the multi-layer stack 490. The stack 490 includes a substrate 401, an insulating film 450 on the substrate, and a portion of a source line SL0A arranged above the insulating film 450. NAND string NS0B has a source end 494 and a drain end 492. A portion of a bit line BL0A is also depicted. Dashed lines depict memory cells and select gate transistors. Memory holes MH0s, MH1s, MH2s and MH3s are associated with NAND strings NS0B, NS1B, NS2B and NS3B. Word line layers are WL0A, WL1A, WL2A and WL3A. Dielectric layers are D0A, D1A, D2A, D3A, D4A, D5A and D6A. SGSA is a source-side select gate layer and SGDA is a drain-side select gate layer. As depicted, in contrast to U-shaped NAND strings in which the source lines and bit lines connect to the U-shaped NAND strings at the top of the NAND strings, with single vertical NAND strings the bit lines connect to the vertical NAND strings at the top of the NAND strings and the source lines connect to the vertical NAND strings at the bottom of the NAND strings.

Figure 5:
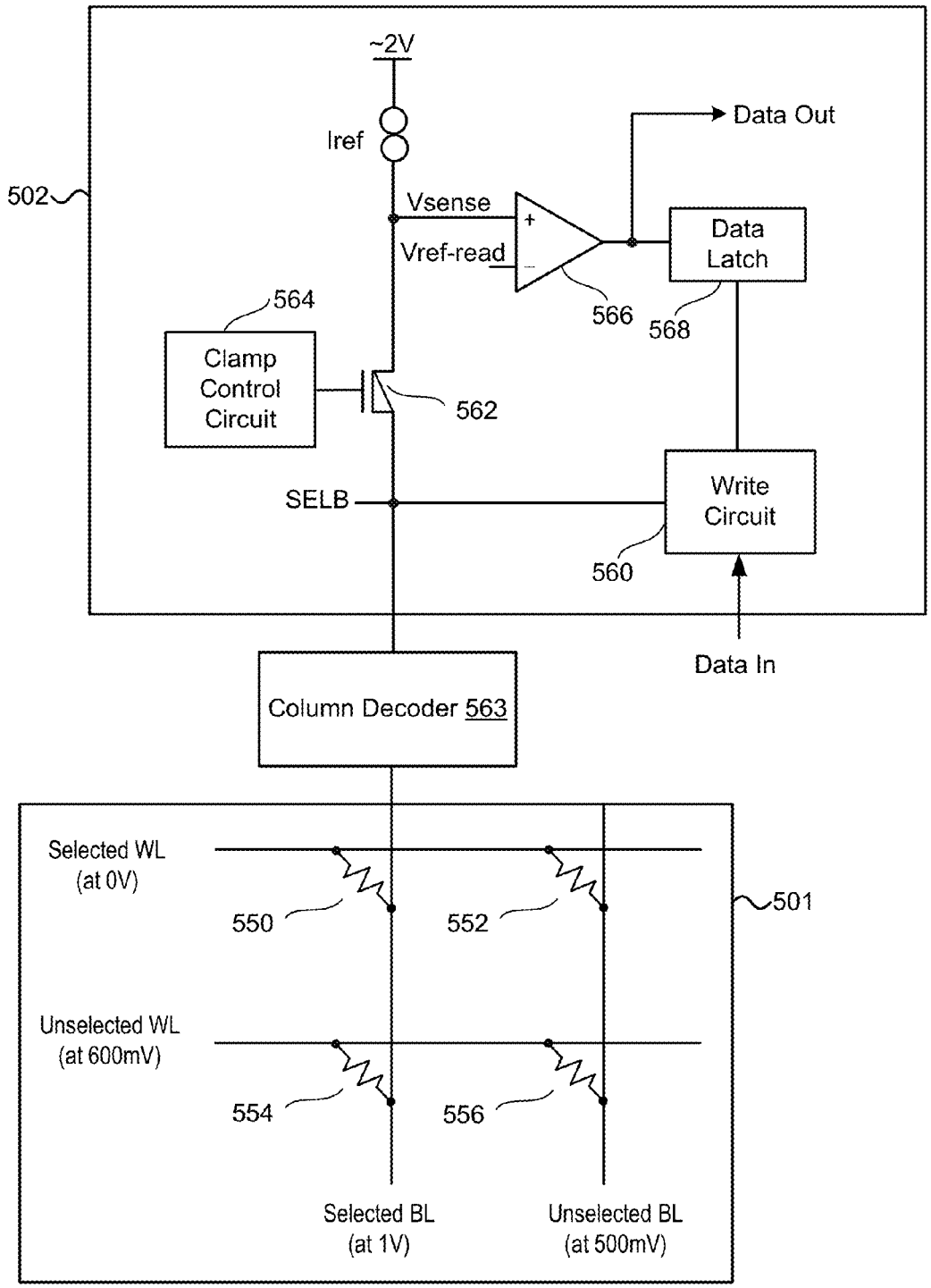
FIG. 5 depicts one embodiment of a read/write circuit.

FIG. 5 depicts one embodiment of a read/write circuit 502 along with a portion of a memory array 501. Read/write circuit 502 is one example of an implementation of read/write circuit 156 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 2A. In another embodiment, the portion of a memory array 501 may comprise a memory array with bit lines arranged in a vertical direction that is perpendicular to the substrate, such as memory array 316 in FIG. 3A.

As depicted, during a memory array operation (e.g., a programming operation), the selected bit line may be biased to 1V, the unselected word line may be biased to 0.6V, the selected word line may be biased to 0V, and the unselected bit line may be biased to 0.5V. In some embodiments, during a second memory array operation, the selected bit line may be biased to a selected bit line voltage (e.g., 2.0V), the unselected word line may be biased to an unselected word line voltage (e.g., 1.0V), the selected word line may be biased to a selected word line voltage (e.g., 0V), and the unselected bit line may be biased to an unselected bit line voltage (e.g., 1V). In this case, the unselected memory cells sharing the selected word line will be biased to the voltage difference between the selected word line voltage and the unselected bit line voltage. In other embodiments, the memory array biasing scheme depicted in FIG. 5 may be reversed such that the selected bit line is biased to 0V, the unselected word line is biased to 0.4V, the selected word line is biased to 1V, and the unselected bit line is biased to 0.5V.

As depicted in FIG. 5, the SELB node of read/write circuit 502 may be electrically coupled to the selected bit line via column decoder 563. In one embodiment, column decoder 563 may correspond with column decoder 152 depicted in FIG. 1E. Transistor 562 couples (or electrically connects) node SELB to the Vsense node. The transistor 562 may comprise a low VT nMOS device. Clamp control circuit 564 controls the gate of transistor 562. The Vsense node is connected to reference current Tref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the Data In terminal, and data latch 568.

In one embodiment, during a read operation, read/write circuit 502 biases the selected bit line to the selected bit line voltage in read mode. Prior to sensing data, read/write circuit 502 will precharge the Vsense node to 2V (or some other voltage greater than the selected bit line voltage). When sensing data, read/write circuit 502 attempts to regulate the SELB node to the selected bit line voltage (e.g., 1V) via clamp control circuit 564 and transistor 562 in a source-follower configuration. If the current through the selected memory cell 550 is greater than the read current limit, Iref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 may latch the output of sense amplifier 566 after a time period of sensing the current through the selected memory cell (e.g., after 400 ns).

In one embodiment, during a write operation, if the Data In terminal requests a data "0" to be written to a selected memory cell, then read/write circuit 502 may bias SELB to the selected bit line voltage for programming a data "0" in write mode (e.g., 1.2V for a SET operation) via write circuit 560. The duration of programming the memory cell may be a fixed time period (e.g., using a fixed-width programming pulse) or variable (e.g., using a write circuit 560 that senses whether a memory cell has been programmed while programming). If the Data In terminal requests a data "1" to be written, then read/write circuit 502 may bias SELB to the selected bit line voltage for programming a data "1" in write mode (e.g., 0V or -1.2V for a RESET operation) via write circuit 560. In some cases, if a selected memory cell is to maintain its current state, then the write circuit 560 may bias SELB to a program inhibit voltage during write mode. The program inhibit voltage may be the same as or close to the unselected bit line voltage.

Figure 6A:
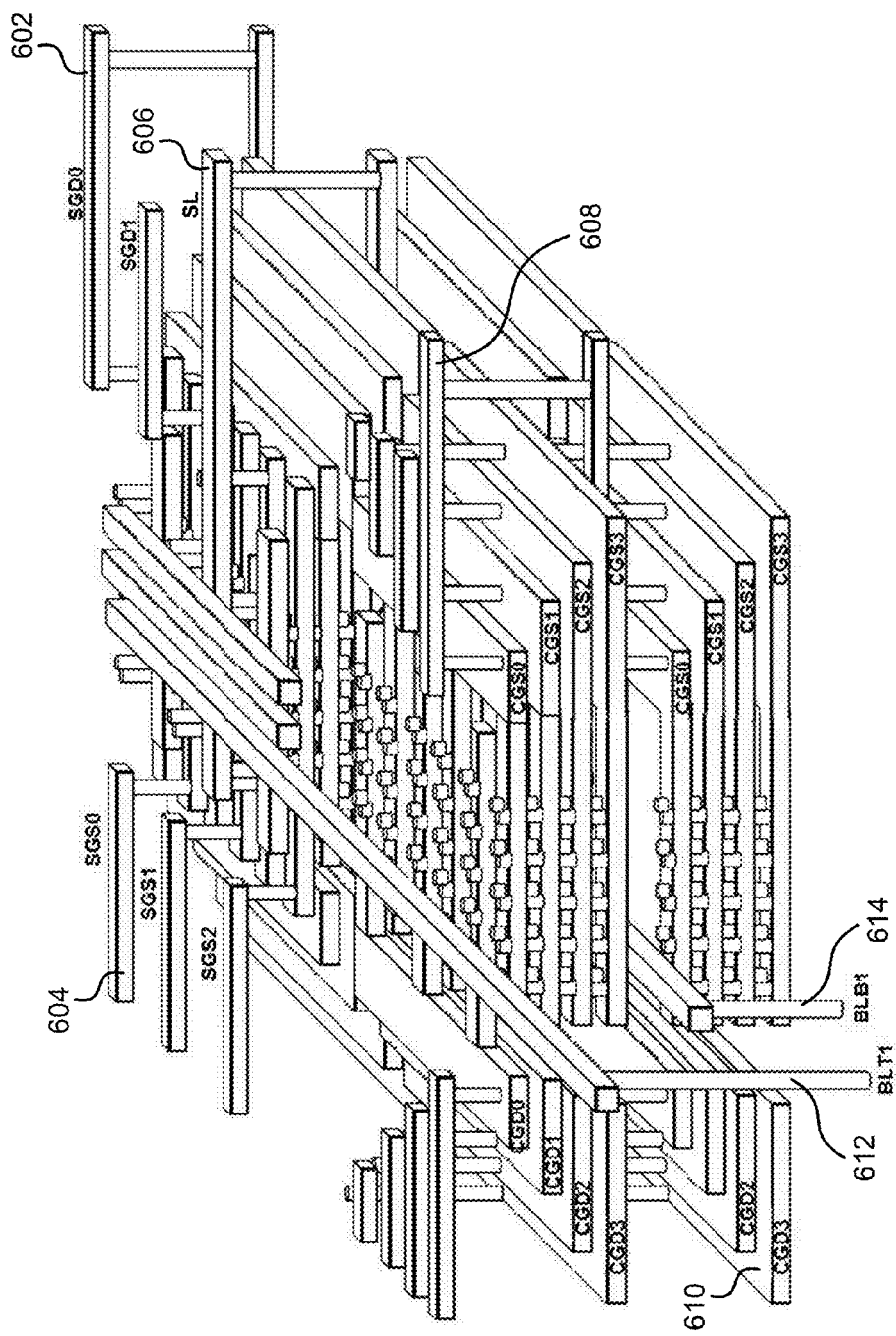
FIG. 6A depicts one embodiment of vertically stacked memory arrays.

FIG. 6A depicts one embodiment of vertically stacked memory arrays. A first memory array including a first NAND string may be positioned above a second memory array including a second NAND string. As depicted, a first NAND string connected to bit line 612 (BLT0) may be positioned above a second NAND string connected to bit line 614 (BLB1). A first word line 608 may be connected to a first control gate CGS0 of a first memory cell transistor within the first NAND string. The first word line 608 may also be shorted to a first control gate CGS0 of a second memory cell transistor within the second NAND string. A source line 606 (SL) may be connected to a source of a source-side select gate of the first NAND string. The source line 606 may also be shorted to a source of a source-side select gate of the second NAND string. A drain-side select gate line 602 (SGD0) may connect to a gate of a drain-side select gate of the first NAND string. The drain-side select gate line 602 may also be shorted to the gate of a drain-side select gate of the second NAND string. In some cases, a source-side select gate line 604 (SGS0) may connect to a gate of a source-side select gate of the first NAND string. The source-side select gate line 604 may also be shorted to the gate of a source-side select gate of the second NAND string. A control gate CGD3 on the drain-side of the first NAND string may be shorted to a control gate 610 on the drain-side of the second NAND string. The first word line 608 may also be shorted to a first control gate CGS0 of a second memory cell transistor within the second NAND string. In this case, to provide selectivity for memory cells within the first and second NAND strings, the bit lines 612 and 614 may be biased to different voltages during a memory operation (e.g., a read operation).

In some cases, each control gate in the second memory array may be shorted to a corresponding control gate in the first memory array. For example, the control gates CGS0-CGS3 of the second memory array may be shorted to the corresponding control gates CGS0-CGS3 of the first memory array and the control gates CGD0-CGD3 of the second memory array may be shorted to the corresponding control gates CGD0-CGD3 of the first memory array. Moreover, the source-side select gates and/or the drain-side select gates in the second memory array may be shorted to corresponding source-side select gates and drain-side select gates in the first memory array. For example, the drain-side select gates SGD0-SGD1 of the second memory array may be shorted to the corresponding drain-side select gates SGD0-SGD1 of the first memory array and the source-side select gates SGS0-SGS2 of the second memory array may be shorted to the corresponding source-side select gates SGS0-SGS2 of the first memory array.

Figure 6B:
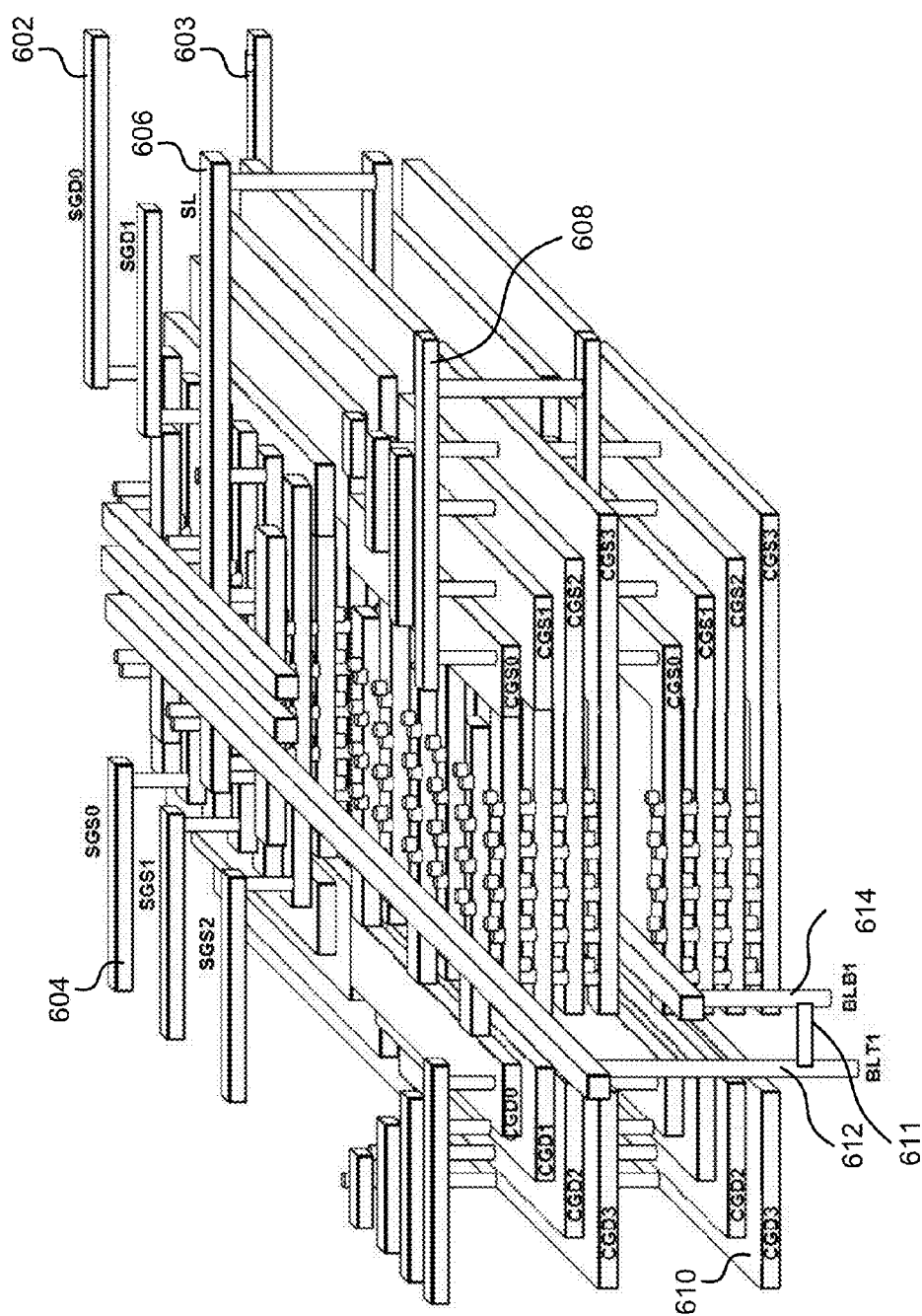
FIG. 6B depicts another embodiment of vertically stacked memory arrays.

FIG. 6B depicts another embodiment of vertically stacked memory arrays. As depicted, the bit lines 612 and 614 have been shorted together via connection 611 (e.g., a metal wire). In this case, to provide selectivity for memory cells within the first and second NAND strings, the drain-side select gates driven by drain-side select gate line 602 connected to a drain-side select gate of the first NAND string and drain-side select gate line 603 connected to a drain-side select gate of the second NAND string may be biased to different voltages during a memory operation (e.g., a program verify operation). In one example, the drain-side select gate of the first NAND string may be set into a conducting state during the memory operation while the drain-side select gate of the second NAND string may be set into a non-conducting state during the memory operation.

In one embodiment, the NAND structure used for implementing the first NAND string may comprise a U-shaped NAND string and the NAND structure for implementing the second NAND sting may also comprise a U-shaped NAND string. In another embodiment, the NAND structure used for implementing the first NAND string may comprise a U-shaped NAND string and the NAND structure for implementing the second NAND string may also comprise a single vertical NAND string. In another embodiment, the NAND structure used for implementing the first NAND string may comprise a single vertical NAND string and the NAND structure for implementing the second NAND string may also comprise a U-shaped NAND string. In another embodiment, the NAND structure used for implementing the first NAND string may comprise a U-shaped NAND string, the NAND structure for implementing the second NAND string may also comprise a U-shaped NAND string, and the NAND structure for implementing a third NAND string arranged above the first NAND string may comprise a single vertical NAND string.

In some cases, the bit lines, source lines, drain-side select gate lines, and source-side select gate lines of a first memory array and a second memory array positioned below the first memory array may be electrically shorted together. In this case, individual control of the word lines connected to the first memory array and the second memory array may enable selectivity for memory cells within the first memory array and the second memory array. A first set of word line drivers may drive word lines connected to control gates for the first NAND string and a second set of word line drivers may drive other word lines connected to control gates for the second NAND string.

Figure 7A:
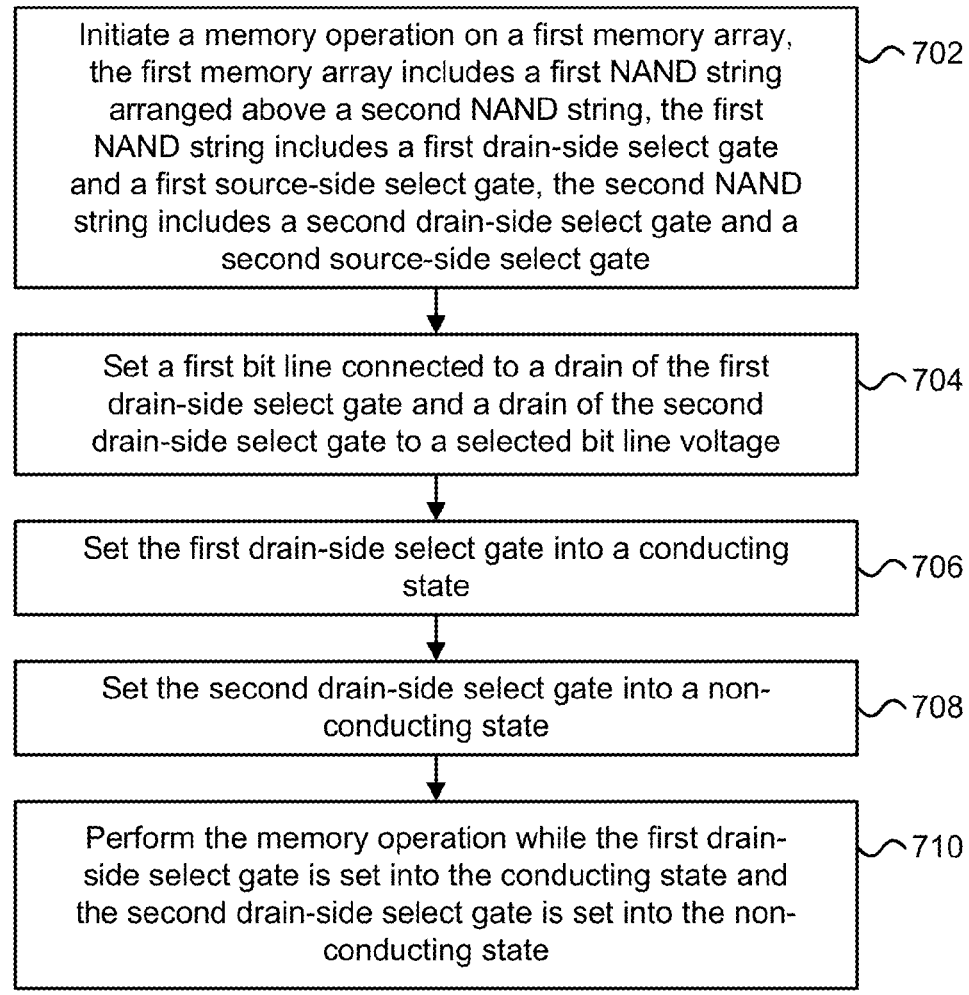
FIG. 7A is a flowchart describing one embodiment of a process for performing a memory operation using vertically stacked memory arrays.

FIG. 7A is a flowchart describing one embodiment of a process for performing a memory operation using vertically stacked memory arrays. In one embodiment, the process of FIG. 7A may be performed by a memory system, such as memory system 101 in FIG. 1A.

In step 702, a memory operation is initiated for a first memory array. The memory operation may comprise a read operation, a program verify operation, or a write operation. The first memory array may include a first NAND string arranged above a second NAND string. The first NAND string may include a first drain-side select gate and a first source-side select gate. The second NAND string may include a second drain-side select gate and a second source-side select gate.

In step 704, a first bit line connected to a drain of the first drain-side select gate is set to a selected bit line voltage (e.g., 0.2V or 0.6V). A drain of the second drain-side select gate may also be set to the selected bit line voltage. In step 706, the first drain-side select gate is set into a conducting state. In step 708, the second drain-side select gate is set into a non-conducting state. In step 710, the memory operation is performed while the first drain-side select gate is set into the conducting state and the second drain-side select gate is set into the non-conducting state. In one embodiment, the first NAND string may comprise a U-shaped NAND string and the second NAND string may comprise another U-shaped NAND string. In another embodiment, the first NAND string may comprise a single vertical NAND string and the second NAND string may comprise another single vertical NAND string. In another embodiment, the first NAND string may comprise a single vertical NAND string and the second NAND string may comprise a U-shaped NAND string. One benefit of forming a single vertical NAND string above a U-shaped NAND string is that the source lines for the NAND strings may be shorted together within the same metal layer.

Figure 7B:
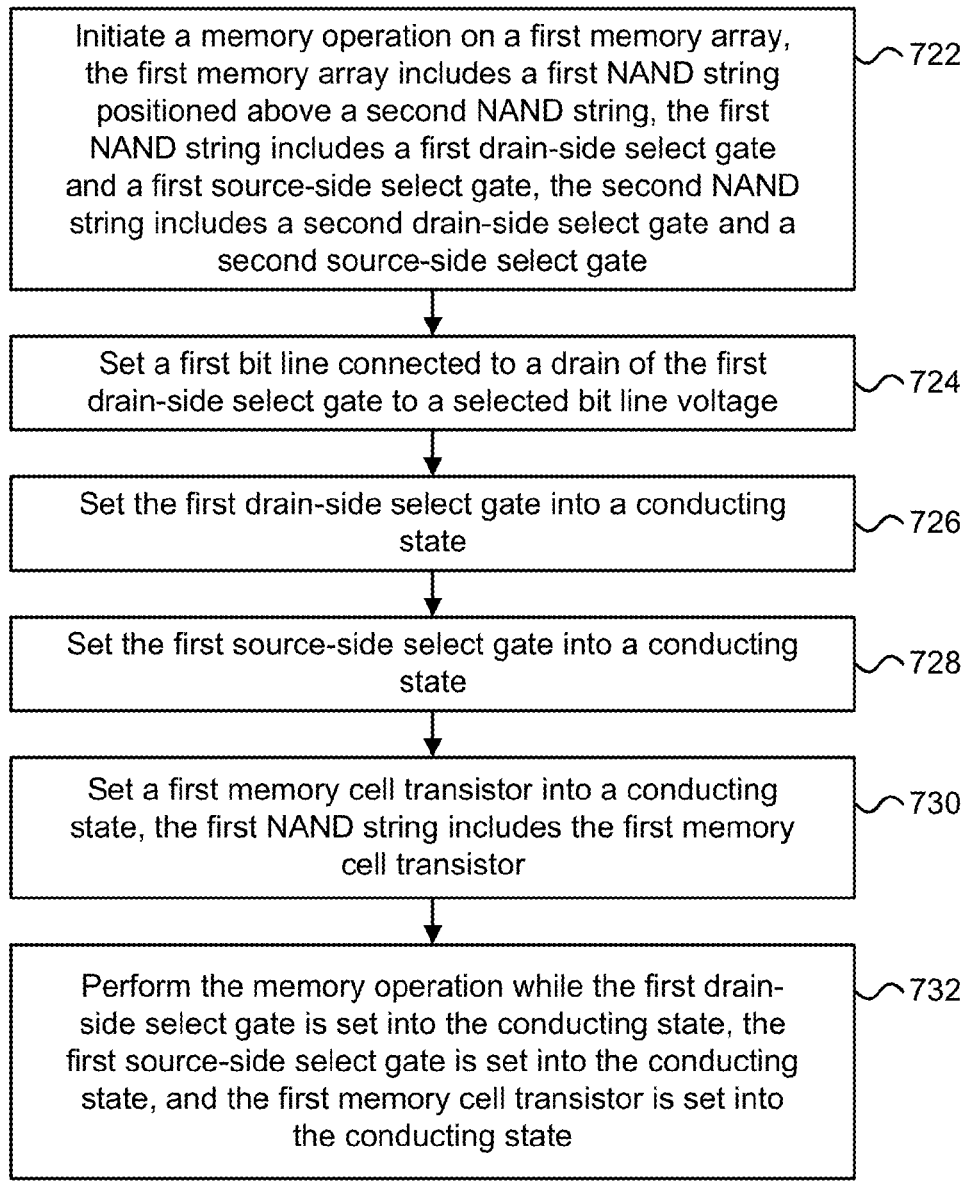
FIG. 7B is a flowchart describing another embodiment of a process for performing a memory operation using vertically stacked memory arrays.

FIG. 7B is a flowchart describing another embodiment of a process for performing a memory operation using vertically stacked memory arrays. In one embodiment, the process of FIG. 7B may be performed by a memory system, such as memory system 101 in FIG. 1A.

In step 722, a memory operation is initiated for a first memory array. The memory operation may comprise a read operation, a write operation, or a program verify operation. The first memory array may include a first NAND string positioned above a second NAND string. The second NAND string may be part of a second memory array different from the first memory array. The first NAND string may include a first drain-side select gate and a first source-side select gate. The second NAND string may include a second drain-side select gate and a second source-side select gate. In step 724, a first bit line connected to a drain of the first drain-side select gate is set to a selected bit line voltage. In step 726, the first drain-side select gate is set into a conducting state. In step 728, the first source-side select gate is set into a conducting state. In step 730, a first memory cell transistor is set into a conducting state. The first NAND string may include the first memory cell transistor and one or more other memory cell transistors. In step 732, the memory operation is performed while the first drain-side select gate set into the conducting state, the first source-side select gate is set into the conducting state, and the first memory cell transistor is set into the conducting state.

One embodiment of the disclosed technology includes a first NAND string and a second NAND string. The first NAND string includes a first drain-side select gate, a first set of memory cell transistors, and a first source-side select gate. The second NAND string arranged below the first NAND string. The second NAND string includes a second drain-side select gate and a second set of memory cell transistors. The second NAND string includes a second source-side select gate. A source of the second source-side select gate is connected to a source of the first source-side select gate during a memory operation.

One embodiment of the disclosed technology includes setting a first bit line connected to a first NAND string to a selected bit line voltage during a memory operation. The first NAND string includes a first drain-side select gate, a first set of memory cell transistors, and a first source-side select gate. The method further comprises setting the first drain-side select gate into a conducting state during the memory operation. The first NAND string is arranged above a second NAND string. The second NAND string includes a second drain-side select gate and a second set of memory cell transistors. The second NAND string includes a second source-side select gate. A source of the second source-side select gate is connected to a source of the first source-side select gate during the memory operation.

One embodiment of the disclosed technology includes a first memory array and a second memory array. The first memory array includes a first vertical NAND string. The first vertical NAND string includes a first drain-side select gate, a first set of memory cell transistors, and a first source-side select gate. The second memory array positioned below the first memory array. The second memory array includes a second vertical NAND string. The second vertical NAND string includes a second drain-side select gate and a second set of memory cell transistors. The second vertical NAND string includes a second source-side select gate. A source of the second source-side select gate is shorted to a source of the first source-side select gate during a memory operation. The first set of memory cell transistors comprises a first number of transistors and the second set of memory cell transistors comprises a second number of transistors different from the first number of transistors.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
a first NAND string, the first NAND string includes a first drain-side select gate, a first set of memory cell transistors, and a first source-side select gate; and
a second NAND string arranged below the first NAND string, the second NAND string includes a second drain-side select gate and a second set of memory cell transistors, the second NAND string includes a second source-side select gate, a source of the second source-side select gate is connected to a source of the first source-side select gate during a memory operation, the first set of memory cell transistors comprises a first number of transistors and the second set of memory cell transistors comprises a second number of transistors different from the first number of transistors, the first NAND string comprises a first vertical NAND structure that comprises one of a single vertical NAND string or a pipe-shaped vertical NAND string, the second NAND string comprises a second vertical NAND structure that comprises one of the single vertical NAND string or the pipe-shaped vertical NAND string, the first vertical NAND structure is different from the second vertical NAND structure.

2. The apparatus of claim 1, wherein:
the second number of transistors is greater than the first number of transistors.

3. The apparatus of claim 1, wherein:
the first set of memory cell transistors comprises a set of charge trap transistors.

4. The apparatus of claim 1, wherein:
the memory operation comprises a read operation.

5. The apparatus of claim 1, wherein:
the source of the second source-side select gate is physically shorted to the source of the first source-side select gate.

6. The apparatus of claim 1, wherein:
gates of the first set of memory cells are electrically connected to gates of the second set of memory cells during the memory operation.

7. The apparatus of claim 1, wherein:
a first bit line connected to a drain of the first drain-side select gate is connected to a first sense amplifier during the memory operation and a second bit line connected to a drain of the second drain-side select gate is connected to a second sense amplifier during the memory operation.

8. The apparatus of claim 1, wherein:
a first bit line connected to a drain of the first drain-side select gate is shorted to a second bit line connected to a drain of the second drain-side select gate during the memory operation.

9. The apparatus of claim 8, wherein:
the first drain-side select gate is set into a conducting state during the memory operation; and
the second drain-side select gate is set into a non-conducting state during the memory operation.

10. The apparatus of claim 1, wherein:
the first NAND string is part of a memory array, the memory array comprises a non-volatile memory that is monolithically formed in one or more physical levels of memory cells having active areas disposed above a silicon substrate.

11. A method, comprising:
setting a first bit line connected to a first NAND string to a selected bit line voltage during a memory operation, the first NAND string includes a first drain-side select gate, a first set of memory cell transistors, and a first source-side select gate; and
setting the first drain-side select gate into a conducting state during the memory operation, the first NAND string is arranged above a second NAND string, the second NAND string includes a second drain-side select gate and a second set of memory cell transistors, the second NAND string includes a second source-side select gate, a source of the second source-side select gate is connected to a source of the first source-side select gate during the memory operation, the first set of memory cell transistors comprises a first number of transistors and the second set of memory cell transistors comprises a second number of transistors different from the first number of transistors, the first NAND string comprises a first vertical NAND structure that comprises one of a single vertical NAND string or a pipe-shaped vertical NAND string, the second NAND string comprises a second vertical NAND structure that comprises one of the single vertical NAND string or the pipe-shaped vertical NAND string, the first vertical NAND structure is different from the second vertical NAND structure.

12. The method of claim 11, wherein:

the second number of transistors is greater than the first number of transistors.

13. A system, comprising:

a first memory array, the first memory array includes a first vertical NAND string, the first vertical NAND string includes a first drain-side select gate, a first set of memory cell transistors, and a first source-side select gate; and a second memory array positioned below the first memory array, the second memory array includes a second vertical NAND string, the second vertical NAND string includes a second drain-side select gate and a second set of memory cell transistors, the second vertical NAND string includes a second source-side select gate, a source of the second source-side select gate is shorted to a source of the first source-side select gate during a memory operation, the first set of memory cell transistors comprises a first number of transistors and the second set of memory cell transistors comprises a second number of transistors different from the first number of transistors, the first vertical NAND string comprises a first vertical NAND structure that comprises one of a single vertical NAND string or a pipe-shaped vertical NAND string, the second vertical NAND string comprises a second vertical NAND structure that comprises one of the single vertical NAND string or the pipe-shaped vertical NAND string, the first vertical NAND structure is different from the second vertical NAND structure.

14. The system of claim 13, wherein:

the first vertical NAND string comprises a single vertical NAND string and the second vertical NAND string comprises a pipe-shaped NAND string; and the memory operation comprises a read operation.

* * * * *